United States Patent
Tanner et al.

(10) Patent No.: US 8,252,624 B2
(45) Date of Patent: Aug. 28, 2012

(54) METHOD OF MANUFACTURING THIN FILM SOLAR CELLS HAVING A HIGH CONVERSION EFFICIENCY

(75) Inventors: David Tanner, San Jose, CA (US); Hien-Minh Huu Le, San Jose, CA (US); Quancheng (Tommy) Gu, Fremont, CA (US); Shuran Sheng, Cupertino, CA (US); Yong Kee Chae, San Ramon, CA (US); Tzay-Fa (Jeff) Su, San Jose, CA (US); Dapeng Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/980,132

(22) Filed: Dec. 28, 2010

(65) Prior Publication Data

US 2011/0177648 A1 Jul. 21, 2011

Related U.S. Application Data

(60) Provisional application No. 61/295,991, filed on Jan. 18, 2010.

(51) Int. Cl.
*H01L 21/00* (2006.01)

(52) U.S. Cl. ........ 438/96; 438/97; 438/98; 257/E31.023

(58) Field of Classification Search ............... 438/96, 438/97, 98; 257/E31.023
See application file for complete search history.

(56) References Cited

U.S. PATENT DOCUMENTS

| | | | |
|---|---|---|---|
| 6,180,870 B1* | 1/2001 | Sano et al. | 136/258 |
| 2008/0115828 A1* | 5/2008 | Taylor | 136/256 |
| 2008/0178932 A1* | 7/2008 | Den Boer et al. | 136/256 |
| 2009/0020154 A1* | 1/2009 | Sheng et al. | 136/255 |
| 2009/0104733 A1* | 4/2009 | Chae et al. | 438/97 |
| 2009/0304912 A1* | 12/2009 | Kwak et al. | 427/108 |

* cited by examiner

*Primary Examiner* — Kevin Parendo
(74) *Attorney, Agent, or Firm* — Patterson & Sheridan, LLP

(57) ABSTRACT

A method and apparatus for forming solar cells is provided. In one embodiment, a photovoltaic device includes a antireflection coating layer disposed on a first surface of a substrate, a barrier layer disposed on a second surface of the substrate, a first transparent conductive oxide layer disposed on the barrier layer, a conductive contact layer disposed on the first transparent conductive oxide layer, a first p-i-n junction formed on the conductive contact layer, and a second transparent conductive oxide layer formed on the first p-i-n junction.

21 Claims, 6 Drawing Sheets

METHOD OF MANUFACTURING THIN FILM SOLAR CELLS HAVING A HIGH CONVERSION EFFICIENCY

CROSS-REFERENCE TO RELATED APPLICATIONS

This application claims benefit of U.S. Provisional Patent Application Ser. No. 61/295,991, filed Jan. 18, 2010, which is incorporated by reference herein.

BACKGROUND OF THE INVENTION

1. Field of the Invention

Embodiments of the present invention generally relate to solar cells and methods for forming the same. More particularly, embodiments of the present invention relate to methods for manufacturing thin-film solar cells with high conversion efficiency.

2. Description of the Related Art

Solar cells convert solar radiation and other light into usable electrical energy. The energy conversion occurs as the result of the photovoltaic effect. Solar cells may be formed from crystalline material or from amorphous or microcrystalline materials. Generally, there are two major types of solar cells that are produced in large quantities today, which are crystalline silicon solar cells and thin film solar cells. Crystalline silicon solar cells typically use either mono-crystalline substrates (i.e., single-crystal substrates of pure silicon) or a multi-crystalline silicon substrates (i.e., poly-crystalline or polysilicon). Additional film layers are deposited onto the silicon substrates to improve capture of light, form the electrical circuits, and protect the devices. Suitable substrates include glass, metal, and polymer substrates. It has been found that the properties of thin-film solar cells degrade over time upon exposure to light, which can cause the device stability to be less than desired. Typical solar cell properties that may degrade are the fill factor (FF), short circuit current, and open circuit voltage (Voc).

Thin film silicon solar cells have gained a significant market share due to low-cost, large-area deposition of the amorphous-microcrystalline silicon absorber layers. Thin-film solar cells use thin layers of materials deposited on suitable substrates to form one or more p-n junctions. Generally, different material layers perform different functions formed in the solar cells. In some instances, some material layers may server as a light absorber layer that may have high light-trapping effect to absorb light in the absorber layer to generate high current. In contrast, some material layers are configured to reflect and scatter light to the solar cells formed on the substrate so as to assist light retaining in the solar cell for a longer time for current generation. However, absorption loss may often occurs when light transmitting through these reflective material layers, thereby adversely reducing overall electrical performance and conversion efficiency of the solar cell junctions formed on the substrate. To expand the economic uses of solar cells, efficiency must be improved. Solar cell efficiency relates to the proportion of incident radiation converted into useful electricity. To be useful for more applications, solar cell efficiency must be improved beyond the current best performance of approximately 15%. With energy costs rising, there is a need for improved thin film solar cells and methods and apparatuses for forming the same in a factory environment.

SUMMARY OF THE INVENTION

Embodiments of the invention provide methods of forming solar cells. In one embodiment, a photovoltaic device includes a ARC layer disposed on a first surface of a substrate, a barrier layer disposed on a second surface of the substrate, a first TCO layer disposed on the barrier layer, a conductive contact layer disposed on the first TCO layer, a first p-i-n junction formed on the conductive contact layer, and a second TCO layer formed on the first p-i-n junction.

Embodiments of the invention may further provide a photovoltaic device, comprising a substrate having a first surface and a second surface, a barrier layer disposed on the first surface of the substrate, a first transparent conductive oxide layer disposed on the barrier layer, a conductive contact layer disposed on the first transparent conductive oxide layer, wherein the conductive contact layer comprises a tin oxide layer, a titanium oxide layer, a tantalum layer, a tantalum oxide layer, a niobium doped tin oxide layer, or a niobium doped titanium oxide layer, a first p-i-n junction formed on the conductive contact layer, and a second transparent conductive oxide layer formed over the first p-i-n junction.

Embodiments of the invention may further provide a photovoltaic device, comprising a substrate having a first surface and a second surface, wherein the substrate comprises a glass material having an iron concentration less than about 0.03% by weight, a barrier layer disposed on the first surface of the substrate, a first transparent conductive oxide layer disposed on the barrier layer, a first p-i-n junction comprising a p-type amorphous silicon layer formed over the first transparent conductive oxide layer, an intrinsic type amorphous silicon layer formed over the p-type amorphous silicon layer, and an n-type microcrystalline silicon carbide layer formed over the intrinsic type amorphous silicon layer, a conductive contact layer disposed between the first transparent conductive oxide layer and the p-type amorphous silicon layer, wherein the index of refraction of the material in the conductive contact layer is between the index of refraction of the material in the first transparent conductive oxide layer and the index of refraction of the material in the p-type amorphous silicon layer, and the electrical sheet resistance of the combination of the formed first transparent conductive oxide layer and the formed conductive contact layer is less than about 10 Ohms per square, a second p-i-n junction comprising a p-type microcrystalline silicon layer disposed over the n-type microcrystalline silicon carbide layer, an intrinsic type microcrystalline silicon layer formed over the p-type microcrystalline silicon layer, and an n-type amorphous silicon layer formed over the intrinsic type microcrystalline silicon layer, a conductive index matching layer disposed on the n-type amorphous silicon layer, and a second transparent conductive oxide layer formed over the conductive index matching layer.

Embodiments of the invention may further provide a photovoltaic device, comprising a substrate having a first surface and a second surface, a barrier layer disposed on the second surface of the substrate, a first transparent conductive oxide layer disposed on the barrier layer, a conductive contact layer disposed on the first transparent conductive oxide layer, a first p-i-n junction formed on the conductive contact layer, wherein the first p-i-n junction further comprises a p-type amorphous silicon layer, an intrinsic type amorphous silicon layer, and a n-type microcrystalline silicon carbide layer, a second transparent conductive oxide layer formed over the first p-i-n junction, and a metal back electrode formed on the second transparent conductive oxide layer, wherein the metal back electrode comprises silver and palladium.

Embodiments of the invention may further provide a method of forming a solar cell device, comprising forming a first transparent conductive oxide layer over a first surface of a substrate, wherein the first transparent conductive oxide layer comprises tin and oxygen, and the substrate comprises a glass material having an iron concentration less than about 0.03% by weight, forming a conductive contact layer disposed on the first transparent conductive oxide layer, wherein the resistivity of the first transparent conductive oxide layer and conductive contact layer is less than about 10 Ohms per square, and forming a first p-i-n junction on the conductive contact layer, wherein forming the first p-i-n junction comprises forming a p-doped amorphous silicon layer on the conductive contact layer, forming an intrinsic type amorphous silicon layer over the p-type amorphous silicon layer, and forming a an n-type microcrystalline silicon layer on the conductive contact layer.

Embodiments of the invention may further provide a method of forming a solar cell device, comprising forming a first transparent conductive oxide layer over a first surface of a substrate, wherein the first transparent conductive oxide layer comprises tin and oxygen, forming a conductive contact layer disposed on the first transparent conductive oxide layer, forming a first p-i-n junction over the conductive contact layer, wherein forming the first p-i-n junction comprises forming a p-doped amorphous silicon layer on the conductive contact layer, forming an intrinsic type amorphous silicon layer over the p-type amorphous silicon layer, wherein forming the intrinsic type amorphous silicon layer comprises providing a gas mixture to the surface of the substrate in a processing chamber, wherein the gas mixture includes a ratio of a hydrogen gas to a silane gas less than 6, controlling a substrate temperature between about 220 degrees Celsius and about 250 degrees Celsius, and controlling a process pressure in the processing chamber at between about 1 Torr and about 2 Torr, forming an n-type microcrystalline silicon layer on the intrinsic type amorphous silicon layer, forming a second p-i-n junction over the first p-i-n junction, wherein forming the second p-i-n junction comprises forming a p-doped microcrystalline silicon layer over the n-type microcrystalline silicon layer, forming an intrinsic type microcrystalline silicon layer over the p-type microcrystalline silicon layer, and forming an n-type on the intrinsic type microcrystalline silicon layer, forming a conductive index matching layer over the first p-i-n junction, and forming a second transparent conductive oxide layer on the conductive index matching layer.

Embodiments of the invention may further provide a method of forming a solar cell device, comprising forming a first transparent conductive oxide layer disposed over a first surface of a substrate, forming a conductive contact layer disposed on the first transparent conductive oxide layer, wherein the conductive contact layer is a niobium doped titanium oxide layer formed in a physical vapor deposition chamber, forming a first p-i-n junction on the conductive contact layer, wherein forming the first p-i-n junction comprises forming a p-doped amorphous silicon layer on the conductive contact layer, forming an intrinsic type amorphous silicon layer over the p-type amorphous silicon layer, forming an n-type microcrystalline silicon layer on the intrinsic type amorphous silicon layer, and forming a second transparent conductive oxide layer over the n-type microcrystalline silicon layer.

In another embodiment, a method of forming a solar cell device includes forming a ARC layer on a first surface of a substrate, forming a barrier layer on a second surface of a substrate, forming a first TCO layer disposed on the barrier layer, forming a conductive contact layer disposed on the first TCO layer, wherein the conductive contact layer is a niobium doped titanium oxide layer formed in a PVD chamber, forming a first p-i-n junction on the conductive contact layer, forming a conductive index matching layer on the first p-i-n junction, and forming a second TCO layer on the conductive index matching layer.

In yet another embodiment, an automated and integrated system for forming a solar cell includes a first deposition chamber that is adapted to deposit a conductive contact layer on a first TCO layer on a first surface of the substrate, wherein an ARC layer is formed on a second surface of the substrate, and wherein a barrier layer is formed between the first surface of the substrate and the first TCO layer, a second deposition chamber that is adapted to deposit a p-type silicon containing layer and an interface barrier layer on the conductive contact layer, a third deposition chamber that is adapted to deposit an intrinsic type silicon-containing layer and, n-type microcrystalline silicon carbide layer or a conductive index matching layer on intrinsic type silicon-containing layer, and an automated conveyor device that is adapted to transfer the substrate between the first deposition chamber, second deposition chamber and third deposition chamber.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Thin-film solar cells are generally formed from numerous types of films, or layers, put together in many different ways. Most films used in such devices incorporate a semiconductor element that may comprise silicon, germanium, carbon, boron, phosphorous, nitrogen, oxygen, hydrogen and the like.

Characteristics of the different films include degrees of crystallinity, dopant type, dopant concentration, film refractive index, film extinction coefficient, film transparency, film absorption, and conductivity. Typically, most of these films can be formed by use of a chemical vapor deposition process, which may include some degree of ionization or plasma formation.

Charge generation during a photovoltaic process is generally provided by a bulk semiconductor layer, such as a silicon containing layer. The bulk layer is also sometimes called an intrinsic layer to distinguish it from the various doped layers present in the solar cell. The intrinsic layer may have any desired degree of crystallinity, which will influence its light-absorbing characteristics. For example, an amorphous intrinsic layer, such as amorphous silicon, will generally absorb light at different wavelengths from intrinsic layers having different degrees of crystallinity, such as microcrystalline silicon. For this reason, most solar cells will use both types of layers to yield the broadest possible absorption characteristics to increase cell conversion efficiency. In some instances, an intrinsic layer may be used as a buffer layer between two dissimilar layer types to provide a smoother transition in optical or electrical properties between the two layers.

Figure 1:
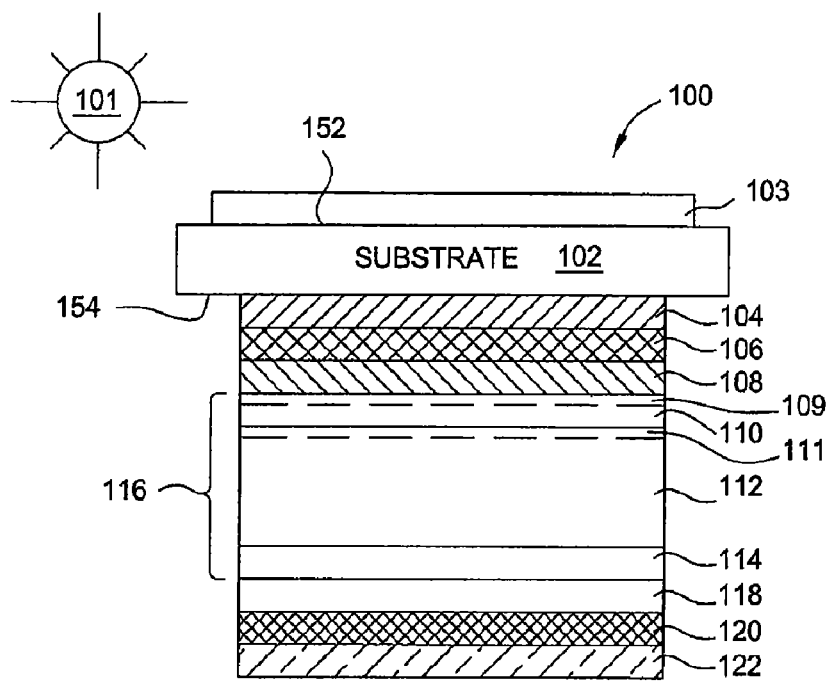
FIG. 1 is schematic side-view of a single junction thin-film solar cell according to one embodiment of the invention.

FIG. 1 is a schematic side-view of a single-junction thin-film solar cell 100 formed on a substrate 102 having a first surface 152 oriented toward light or solar radiation 101. Solar cell 100 comprises the substrate 102, such as a glass substrate, polymer substrate, metal substrate, or other suitable substrate, with thin films formed on a second surface 154 thereover. In one configuration, the substrate 102 is a glass material that is between about 2.6 mm and about 4 mm thick, such as about 3.2 mm thick. In one embodiment, the substrate 102 includes a glass material having relatively low concentration of iron (Fe) element doped therein. It is believed that the lower amount of iron elements doped in the glass substrate will reduce light absorption when light is transmitted through the substrate 102 to the solar cell 100 formed thereon. It is believed that less light will be absorbed in a low iron glass at the longer wavelengths of light, such as wavelength between about 800 nm to about 1100 nm, versus conventional glass materials that are typically used in solar applications, such as soda lime glass. Therefore, a low iron glass containing substrate can be useful when it is used in combination with a solar cell that contains crystalline silicon containing layers (e.g., microcrystalline silicon), since they tend to absorb light within these wavelengths versus amorphous silicon containing layers. In one embodiment, the iron concentration in the substrate 102, such as a glass substrate, is controlled to a level between about 0.01 percent by weight and about 0.03 percent by weight, such as less than about 0.02 percent by weight. In another embodiment, the iron concentration in a glass type substrate 102 is controlled to a level less than about 0.03 percent by weight. In another embodiment, the iron concentration in a glass type substrate 102 is controlled to a level less than about 70 ppm. In yet another embodiment, the iron concentration in a glass type substrate 102 is controlled to a level less than about 7 ppm. In one example, in a tandem type solar cell device (solar cell 200 in FIG. 2), the use of a low iron glass substrate that has a reduced absorption in the longer received wavelengths is used to increase the amount of current generated in the microcrystalline containing second p-i-n junction 136, and thus the tandem junction type thin-film solar cell, or solar cell.

An anti-reflective coating (ARC) layer 103 is formed on the first surface 152 of the substrate 102. In one embodiment, the ARC layer 103 is disposed on the first surface 152 of the substrate 102 to reduce light loss when solar radiation 101 passing through the substrate 102. The ARC layer 103 is selected to have a refractive index between the refractive index of air and the refractive index of the substrate 102. In one embodiment, as the refractive index of air is about 1.0 and the refractive index of the substrate 102, such as a glass substrate (e.g., low iron glass) is typically between about 1.4 and about 1.5, the refractive index of the ARC layer 103 is tuned and selected at between about 1.1 and 1.4, such as about 1.2. It is believed that by selecting an ARC layer with a refractive index between about 1.1 and 1.4, the ARC layer 103 may assist light to smoothly transmit and pass through from the air through the substrate 102 to the film layers formed thereon, which is described below. When light is transmitted from air through the substrate 102, dramatic refractive index change may result in reflection of light back into the air and away from the solar cells 100 formed on the substrate 102. Accordingly, by selecting proper ARC layer 103 materials that tend to act as a buffer layer between air and the substrate 102, the amount of light lost to reflection from the substrate surface can be reduced and/or controlled. Details relating to the selection and properties of the ARC layer 103 will be further described below with referenced to FIG. 3.

The solar cell 100 is formed on the second surface 154 of the substrate 102 opposite to the position where the ARC layer 103 is formed on the substrate 102. The solar cell 100 includes an optional barrier layer 104 formed on the second surface 154 of the substrate 102. Subsequently, a first transparent conductive oxide (TCO) layer 106 is formed on the optional barrier layer 104. In the embodiment wherein the optional barrier layer 104 is not present, the first TCO layer 106 is directly formed on the second surface 154 of the substrate 102. A first p-i-n junction 116 is then formed on the first TCO layer 106. An optional conductive contact layer 108 may be formed between the first TCO layer 106 and the first p-i-n junction 116. In one embodiment wherein the optional conductive contact layer 108 is not present, the first p-i-n junction 116 may be directly formed on the first TCO layer 106. Subsequently, a conductive index matching layer 118, a second TCO layer 120 and the back metal electrode 122 are then consecutively formed on the first p-i-n junction 116.

In one embodiment, the optional barrier layer 104 may be pre-fabricated on and come with the substrate 102 from a glass supplier. The optional barrier layer 104, in one part, has a similar function as the ARC layer 103 described above in that it can increase the amount of light that makes it to the first p-i-n junction 116 by reducing light absorption and reflection within or at the interface with the substrate 102 and the first transparent conductive oxide (TCO) layer 106. The optional barrier layer 104, in another part, is configured to have a low contact resistance and a high adhesion to the substrate 102 and the subsequently to-be-formed first transparent conductive oxide (TCO) layer 106. In one embodiment, the optional barrier layer 104 is selected from a material that has high film transparency, high film conductivity and high electron mobility, which will improve the solar cell efficiency by reducing the absorption and the series resistance between the interconnected solar cells, which are typically formed by use of a scribing process, on the substrate 102. Furthermore, the optional barrier layer 104 may also have certain degree of surface roughness in order to improve light scattering so as to improve light absorption within the solar cell 100. Details relating to the film properties and structure of the optional barrier layer 104 will be described below with referenced to FIG. 4.

The first TCO layer 106 and the second TCO layer 120 may each comprise tin oxide, zinc oxide, indium tin oxide, cadmium stannate, combinations thereof, or other suitable materials. It is understood that the TCO materials may also include additional dopants and components. For example, tin oxide ($SnO_2$) may further include iron (Fe), magnesium (Mg), or other suitable dopants. In the embodiment wherein the $SnO_2$ TCO layer is utilized, it is believed that the $SnO_2$ TCO layer may increase the amount of light that makes it to the first p-i-n junction 116 by reducing light absorption and reflection within or at the interface with the substrate 102 and the first transparent conductive oxide (TCO) layer 106. In one embodiment, a fluorinated tin oxide ($SnO_2$:F) TCO layer 106 is used, since it is relatively inexpensive to form on the substrate and it is easily textured to improve light trapping. In one embodiment, the grain size of a formed tin oxide ($SnO_2$) layer is between about 600 nm to 800 nm in size. In another embodiment, the grain size of a formed tin oxide ($SnO_2$) layer is about three to five times the thickness of the TCO layer 106, or approximately 900 nm to 1500 nm in size, where, for example, the TCO layer 106 is between about 300 nm and about 600 nm thick.

In another example, the TCO material may be a zinc oxide that may further include dopants, such as aluminum, aluminum oxide, gallium, boron, and other suitable dopants. For example, the TCO materials may have zinc oxide comprising 5 atomic % or less of dopants, such as comprising 3 atomic % or less aluminum oxide dopants, such as between about 0.25 atomic percent and 3 atomic % aluminum oxide dopants formed therein. In one embodiment, the first and the second TCO layer 106, 120 may be aluminum doped zinc oxide layer (AZO). In another embodiment, the first and the second TCO layer 106, 120 may be an oxygen rich aluminum doped zinc oxide layer (AZO-$O_2$) having a higher oxygen concentration formed in the AZO layer. It is believed that higher oxygen concentration as well as the high concentration of the aluminum dopants contained in an AZO containing second TCO layer 120 may assist in the reflection of light back to the active regions (e.g., first p-i-n junction 116) of the formed solar cell formed on the substrate 102, thereby increasing current generation in these active region(s) of the solar cell device. In one embodiment, the first TCO layer 106 may be controlled to have about 1 percent by atomic weight of aluminum oxide doped in about 99 percent by atomic weight of zinc oxide. The second TCO layer 120 may be controlled to have about 2 percent by atomic weight of aluminum oxide doped in about 98 percent by atomic weight of zinc oxide. In a PVD process, the oxygen gas supplied in a gas mixture (e.g., gas mixture including oxygen and argon gas) may be controlled at between about 1.5 percent and about 5 percent by volume to create the AZO layer with a desired concentration ratio of oxygen dopants formed therein. In certain instances, the substrate 102 may be provided by the glass manufacturers with the first TCO layer 106 already provided thereon. Typically, the TCO layer(s) 106, 120 may be formed using a chemical vapor deposition (CVD) or physical vapor deposition (PVD) process. An example of a deposition process that may be used to form the TCO layers 106 and/or 120 are further described in the commonly assigned U.S. patent application Ser. No. 12/481,175, filed Jun. 9, 2009, U.S. Provisional Patent Application Ser. No. 61/186,633, filed Jun. 12, 2009, U.S. Provisional Patent Application Ser. No. 61/186,636, filed Jun. 12, 2009, and U.S. Provisional Patent Application Ser. No. 61/244,386, filed Sep. 21, 2009, which are all incorporated by reference herein in their entirety.

To improve light absorption by enhancing light trapping within the first p-i-n junction 116, the substrate and/or one or more of thin films formed thereover may be optionally textured by wet, plasma, ion, and/or mechanical processes. For example, in the embodiment wherein the first TCO layer 106 is textured and the subsequent thin films deposited thereover will generally follow the topography of the surface below it. In one example, the substrate 102, the optional barrier layer 104, the TCO layer 106, and/or the optional conductive contact layer 108 are textured by mechanical, dry etching process, wet chemical etching or other similar means to achieve an average surface roughness of at least about 30 nm. In one embodiment, the average surface roughness is between about 70 nm and about 90 nm. The roughness of the textured surface can be measured and characterized using a scanning electron microscopy (SEM) and atomic force microscopy (AFM). In some embodiments, it is desirable to use a first TCO layer 106 layer that comprises a tin oxide, or doped tin oxide material, versus a zinc oxide containing TCO layer, due to the added material cost, hardware cost and hardware complexity often required to form a good quality zinc oxide layer on the substrate 102 that also has a uniform and desirable roughness after texturing to optimally capture the incident light when the solar cell is in use.

Subsequently, in one embodiment, the conductive contact layer 108 may be formed on the first TCO layer 106. The conductive contact layer 108 provides a good contact interface between the first transparent conductive oxide (TCO) layer 106 and subsequent to-be-formed first p-i-n junction 116. The conductive contact layer 108 is formed to have a high film transparency to help reduce light loss traveling from the first transparent conductive oxide layer (TCO) 106 to the first p-i-n junction 116. Furthermore, the conductive contact layer 108 also assist reducing contact resistance between the TCO layer 106 and the first p-i-n junction 116, which will improve the current flow between the first transparent conductive oxide layer (TCO) 106 and the first p-i-n junction 116, and thus improve the conversion efficiency to the solar cell 100. It should be noted that reducing the conductivity of the layers in the front contact layer stack (e.g., optional barrier layer 104, TCO layer 106 and the conductive contact layer 108) too far can adversely affect the ability of the formed front contact layer stack to transmit the infrared (IR) wavelengths of light to the active regions of the solar cell device due to the unwanted absorption of these wavelengths of light in the stack. Therefore, while a low conductivity front contact layer stack has electrical conductivity benefits, due to optical absorption changes in the high conductivity materials can greatly affect the efficiency of a solar cell by reducing the amount of IR radiation that makes it to the active layers that are able to absorb these wavelengths, such as microcrystalline layers in a tandem junction solar call. Therefore, in one embodiment, the sheet resistance of a stack of layers comprising the TCO layer 106 and the conductive contact layer 108 is between about 8 Ohms per square ($\Omega/\square$) and about 15 Ohms per square ($\Omega/\square$). In one embodiment, the sheet resistance of a stack of layers comprising the TCO layer 106 and the conductive contact layer 108 is between about 8 Ohms per square ($\Omega/\square$) and about 10 Ohms per square ($\Omega/\square$). In yet another embodiment, the sheet resistance of a stack of layers comprising the TCO layer 106 and the conductive contact layer 108 is less than about 15 Ohms per square ($\Omega/\square$).

It should also be noted that the use of low iron glass type substrates 102, while improving optical transmission, will generally adversely affect the apparent conductivity of the front contact structure of the solar cell by reducing the amount of generated current that can flow through the parallel conductive path formed through the more resistive substrate material. The reduction in conductivity of a low iron glass versus a soda lime glass is generally due to the removal of sodium (Na), iron (Fe) and other elements from the substrate material during the glass substrate formation process, thus also making low iron glass generally harder to form and more expensive. In one example, it is believed that the same front contact layer configuration that is able to achieve a sheet resistance of about 10 Ohms per square ($\Omega/\square$) on a soda lime glass substrate would only achieve a greater than about 14 Ohms per square sheet resistance on a low iron concentration glass substrate, due to the difference in resistivity of the substrate material. In one embodiment, it is desirable to form a front contact structure on a low iron glass type substrate 102 that has a measured sheet resistance between about 8 Ohms per square ($\Omega/\square$) and about 15 Ohms per square ($\Omega/\square$). In one embodiment, it is desirable to form a front contact structure on a low iron glass type substrate 102 that has a measured sheet resistance of between about 8 Ohms per square ($\Omega/\square$) and about 10 Ohms per square ($\Omega/\square$). In another embodiment, it is desirable to form a front contact structure on a low iron glass type substrate 102 that has a measured sheet resistance of less than about 15 Ohms per square ($\Omega/\square$). In one example, the sheet resistance of the desired combination of formed layers is measured using a four point probe that is placed in contact with the exposed surface of the conductive contact layer 108.

In one embodiment, a front contact structure having desirable optical and conductivity properties is formed by doping the optional barrier layer 104, TCO layer 106 and/or the conductive contact layer 108 with a conductive dopant material (e.g., indium, aluminum). In one example, the optional barrier layer 104 and/or TCO layer 106 comprise a tin oxide ($SnO_2$) layer that is doped with less than about 10% by weight of indium. In another example, the optional barrier layer 104 and/or TCO layer 106 comprise a tin oxide ($SnO_2$) layer that is doped with less than about 10% by weight of iron (Fe).

In one embodiment, the conductive contact layer 108 may be a titanium layer, titanium oxide layer, tantalum, tantalum oxide, aluminum, aluminum oxide, and doped titanium, doped tantalum or doped aluminum containing layers, such as niobium doped titanium oxide layer, niobium doped titanium oxide layer, aluminum doped titanium oxide or tantalum oxide layer. In one example, the conductive contact layer 108 is a niobium doped titanium oxide layer may have a formula $Nb_xTi_yO_z$ where x has a range between 0.01 and 0.1 and y has a range of between 0.9 and 0.99 and z is about 2. In one embodiment, the conductive contact layer 108 is a niobium doped titanium oxide layer having a niobium dopant concentration less than 1 percent by weight formed in the titanium oxide layer. In one embodiment, the conductive contact layer 108 may have a thickness between about 200 Å and about 700 Å.

In one embodiment, the conductive contact layer 108 may provide good electrical contact between the first transparent conductive oxide layer 106 and subsequent to-be-formed solar cell junctions 116. The conductive contact layer 108 is formed to have a high film transparency to help reduce light loss traveling from the first transparent conductive layer 106 to the subsequent to-be-formed first p-i-n junction 116. In one embodiment, the conductive contact layer 108 may have a film conductivity between about $2 \times 10^{-4}$ ohm-cm and about $2 \times 10^{-3}$ ohm-cm.

Additionally, the optical and electrical film properties of the conductive contact layer 108 may be adjusted or tuned to have a different optical characteristic so as to match and/or provide improved optical properties between the adjacent layers. For example, the refractive indices of the first transparent conductive layer 106 and the adjacent film layers in the first p-i-n junction 116 often have significant difference, as the first transparent conductive layer 106 is often fabricated from a conductive material and the film layers in the first p-i-n junction 116 are often fabricated from one or more semiconductor containing layers, such as a silicon based material. In order to reduce and compensate for the refractive index difference between these layers and provide a smooth optical transition the conductive contact layer 108 formed there between is formed to serve as a refractive index matching layer (e.g., a buffer layer) to reduce the amount of light reflection from the interface between the first transparent conductive layer 106 and the first p-i-n junction 116, due to the refractive index difference between these layers. Accordingly, the conductive contact layer 108 is generally tuned and adjusted to have a refractive index somewhere between the refractive index of the first transparent conductive layer 106 and the layers utilized to form first p-i-n junction 116. In one embodiment, the refractive index of the conductive contact layer 108 is controlled at between about 2.0 and about 2.8, such as about 2.3, as the refractive index of the transparent conductive layer 106 is often about 1.8 to 2.1 and the dielectric layer, such as a silicon based layer, is often about 3.6 to 3.8.

Furthermore, the conductive contact layer 108 may have a high electron mobility so as to help carry the generated electron/hole pairs to the adjacent layers in the formed solar cell device. In one embodiment, the conductive contact layer 108 may formed so that electrons moving through the formed layer has an electron mobility between about 20 V-s/cm$^2$ and about 90 V-s/cm$^2$.

The first p-i-n junction 116 may comprise a p-type amorphous silicon layer 110, an intrinsic type amorphous silicon layer 112 formed over the p-type amorphous silicon layer 110, and an n-type microcrystalline silicon based layer 114 formed over the intrinsic type amorphous silicon layer 112. In one embodiment, the p-type dopants of p-type amorphous silicon layer 110 may comprise a group III element, such as boron or aluminum. In one embodiment, boron is used as the p-type dopant. Examples of boron-containing sources include trimethylboron (TMB (or $B(CH_3)_3$)), diborane ($B_2H_6$), $BF_3$, $B(C_2H_5)_3$, and similar compounds. In one example, TMB is used as the p-type dopant. The n-type dopants of an n-type microcrystalline silicon based layer 114 may each comprise a group V element, such as phosphorus, arsenic, or antimony. In one embodiment, phosphorus is used as the n-type dopant. In certain embodiment wherein the intrinsic type amorphous silicon layer 112 is formed as a film layer having low optical bandgap, an optional interface barrier layer 111 may be formed between the p-type amorphous silicon layer 110 and the intrinsic type amorphous silicon layer 112 to prevent dopant diffusion occurring during the subsequent thermal processes. Details and examples of an optional interface barrier layer 111 and the low film bandgap intrinsic type amorphous silicon layer 112 are disclosed in U.S. application Ser. No. 12/582,323 filed on Oct. 20, 2009, which is incorporated by reference herein in its entirety. Also, further details of the optional interface barrier layer 111 are also further discussed below. In certain embodiments, the p-type amorphous silicon layer 110 may be formed to a thickness between about 60 Å and about 300 Å. In certain embodiments, the optional interface barrier layer 111 may be formed to a thickness between about 1 Å and about 200 Å. In certain embodiments, the intrinsic type amorphous silicon layer 112 may be formed to a thickness between about 1,500 Å and about 3,500 Å. In certain embodiments, the n-type microcrystalline silicon based layer 114 may be formed to a thickness between about 100 Å and about 400 Å. Typically, the layers in the first p-i-n junction 116 are formed using a CVD or PVD process. An example of a deposition process that may be used to form the first p-i-n junction 116 is further described in the U.S. patent application Ser. No. 11/671,988, filed Feb. 6, 2007, which is incorporated herein by reference in its entirety.

Subsequently, in one embodiment, a conductive index matching layer 118 is formed on the first p-i-n junction 116. The conductive index matching layer 118 is configured to increase light reflection back to the first p-i-n junction 116 so as to increase current generation in the junction 116. Similarly, the conductive index matching layer 118 is selected from a material having a refractive index between the refractive index of the adjacent layer found in the first p-i-n junction 116, such as an n-type microcrystalline silicon based layer 114, and the second TCO layer 120. As the refractive index of the n-type microcrystalline silicon based layer 114 is generally around 3 and the refractive index of the second TCO layer 120 is around 1.9, and thus the refractive index of the conductive index matching layer 118 is configured to be between about 1.4 and about 1.8 to increase light reflection back to the first p-i-n junction 116. In one embodiment, the conductive index matching layer 118 is a silicon containing material, such as silicon oxide, silicon oxynitride, silicon nitride, silicon oxycarbide (SiOC), silicon oxycarbon nitride (SiOCN), or other suitable silicon containing materials, or similar materials. In yet another embodiment, the conductive index matching layer 118 may also be configured as transparent conductive oxide layer such as an indium tin oxide (ITO) layer, zinc oxide containing layer, or tin oxide containing layer, as needed. In another embodiment, the conductive index matching layer 118 is not a continuous film layer. For example, the conductive index matching layer 118 may be formed as a non-continuous film layer, such as a thin layer of particles, or islands, that create an uneven surface so as to assist in the reflection and scattering light back to the first p-i-n junction 116. Additionally, the conductive index matching layer 118 may also have a good adhesion to the underlying n-type microcrystalline silicon based layer 114 to provide a good interface there between. Furthermore, the conductive index matching layer 118 also has a high film transparency with low light absorption so as to reduce light loss while transmitting through the conductive matching index layer 118 to the second TCO layer 120. In one embodiment, the conductive matching index layer 118 may have a film thickness between about 50 Å and about 2000 Å, such as about 200 Å.

In one embodiment, subsequently, the second TCO layer 120 is formed over the conductive matching layer 118, and comprises an indium tin oxide (ITO) layer, zinc oxide containing layer, or tin oxide containing layer. In one example, the second TCO layer 120 is formed so that it has a sheet resistance of about 2 to 20 Ohms per square and a thickness between about 50 and 300 nm. After the second TCO layer 120, the back metal electrode 122 is disposed on the second TCO layer 120. The back metal electrode 122 is typically comprises a metal material that is conductive to assist in the transmission of the current generated by the first p-i-n junction 116. In one embodiment, the metal back electrode 122 may comprise two layers that have a high conductivity and also assist in reflecting light back to the first p-i-n junction 116. Details of the structures and film properties of the back metal electrode 122 will be further described below with referenced to FIG. 5.

Figure 2:
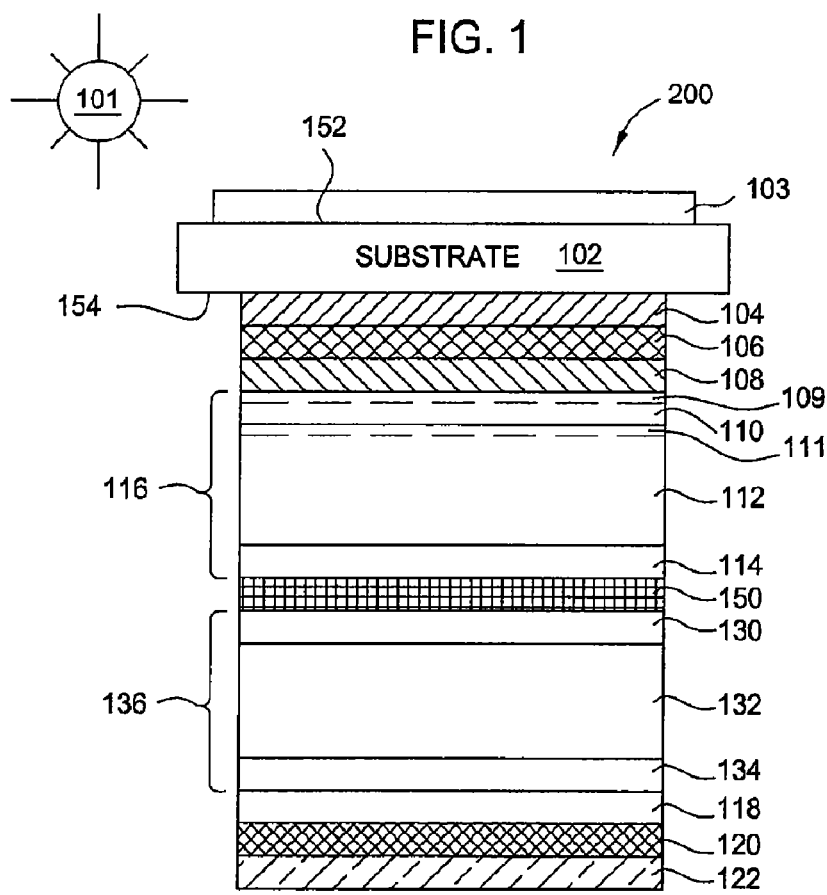
FIG. 2 is a schematic side-view of a tandem junction thin-film solar cell according to one embodiment of the invention.

FIG. 2 is a schematic side-view of a tandem junction type thin-film solar cell, or solar cell 200, according to one embodiment of the invention. Similar to the structure of the single junction thin-film solar cell 100 depicted in FIG. 1, a second p-i-n junction 136 may be disposed between the first p-i-n junction 116 and the conductive index matching layer 118 to assist in the absorption of light in a broader spectrum.

In addition, a wavelength selective reflector (WSR) layer 150 may be optionally disposed between the first p-i-n junction 116 and the second p-i-n junction 136. In one embodiment, the WSR layer 150 actively serves as an intermediate reflector having a desired refractive index, or ranges of refractive indexes, to reflect light received from the light incident side of the solar cell 200. In one embodiment, the WSR layer 150 disposed between the first p-i-n junction 116 and the second p-i-n junction 136 is configured to have film properties that improve light scattering and current generation in the solar cell 200. Additionally, the WSR layer 150 also provides a good p-n tunnel junction that has a high electrical conductivity and a tailored bandgap range that affect its transmissive and reflective properties to improve the formed solar cell's light conversion efficiency. The WSR layer 150 also serves as a junction layer that boosts the absorption of the short to mid wavelengths of light (e.g., 280 nm to 800 nm) in the first p-i-n junction 116 and improves short-circuit current, resulting in improved quantum and conversion efficiency. The WSR layer 150 further has high film transmittance for mid to long wavelengths of light (e.g., 500 nm to 1100 nm) to facilitate the transmission of light to the layers formed in the junction 116. Further, it is generally desirable for the WSR layer 150 to absorb as little light as possible while reflecting desirable wavelengths of light (e.g., shorter wavelengths) back to the layers in the first p-i-n junction 116 and transmitting desirable wavelengths of light (e.g., longer wavelengths) to the layers in the second p-i-n junction 136. Additionally, the WSR layer 150 can be formed with a desirable bandgap and have a high electrical conductivity so as to efficiently conduct the generated current and allow electrons to flow from the first p-i-n junction 116 to the second p-i-n junction 136, and avoid blocking the generated current. The WSR layer 150 is desired to reflect shorter wavelength light back to the first p-i-n junction 116 while allowing substantially all of the longer wavelengths of light to pass to second p-i-n junction 136. By forming the WSR layer 150 that has a high film transmittance of desired wavelengths, a low film light absorption, desirable band gap properties (e.g., wide band gap range), and a high electrical conductivity the overall solar cell conversion efficiency may be improved.

In one embodiment, the WSR layer 150 may be a microcrystalline silicon layer having n-type or p-type dopants disposed within the WSR layer 150. In an exemplary embodiment, the WSR layer 150 is an n-type crystalline silicon alloy having n-type dopants disposed within the WSR layer 150. Different dopants disposed within the WSR layer 150 may also influence the WSR layer film optical and electrical properties, such as bandgap, crystalline fraction, conductivity, transparency, film refractive index, extinction coefficient, and the like. In some instances, one or more dopants may be doped into various regions of the WSR layer 150 to efficiently control and adjust the film bandgap, work function(s), conductivity, transparency and so on. In one embodiment, the WSR layer 150 is controlled to have a refractive index between about 1.4 and about 4, a bandgap of at least about 2 eV, and a conductivity greater than about 0.3 S/cm. In one embodiment, the WSR layer 150 may comprise an n-type doped silicon alloy layer, such as silicon oxide ($SiO_x$, $SiO_2$), silicon carbide (SiC), silicon oxynitride (SiON), silicon nitride (SiN), silicon carbon nitride (SiCN), silicon oxycarbide (SiOC), silicon oxycarbon nitride (SiOCN), or the like. In an exemplary embodiment, the WSR layer 150 is an n-type SiON or SiC layer. Further details and examples of the WSR layers are disclosed in U.S. application Ser. No. 12/208,478 filed on Sep. 11, 2008 by Sheng et al., U.S. Application Ser. No. 61/139,390 filed on Dec. 19, 2008 by Sheng et al., U.S.

application Ser. No. 12/481,175 filed on Jun. 9, 2009 by Sheng et al and U.S. Application Ser. No. 61/227,844 filed on Jul. 23, 2009 by Yang et al., which are all herein incorporated by reference in their entirety.

The second p-i-n junction 136 is formed over the first p-i-n junction 116, or the WSR layer 150, can include a p-type microcrystalline silicon layer 130, an intrinsic microcrystalline silicon layer 132, and an n-type amorphous silicon layer 134. In certain embodiments, the p-type microcrystalline silicon layer 130 may be formed to a thickness between about 100 Å and about 400 Å. In certain embodiments, the intrinsic type microcrystalline silicon layer 132 may be formed to a thickness between about 10,000 Å and about 30,000 Å. In certain embodiments, the n-type amorphous silicon layer 134 may be formed to a thickness between about 100 Å and about 500 Å. Typically, the layers in the second p-i-n junction 136 are formed using a CVD or PVD process. An example of a deposition process that may be used to form the second p-i-n junction 136 is further described in the U.S. patent application Ser. No. 11/671,988, filed Feb. 6, 2007, which is incorporated herein by reference in its entirety.

In operation, solar radiation 101 is primarily absorbed by the intrinsic layers 112, 132 of the p-i-n junctions 116, 136 and is converted to electron-holes pairs. The electric field created between the p-type layers 110, 130 and the n-type layer 114, 134 that stretches across the intrinsic layer 112, 132 causes electrons to flow toward the n-type layers 114, 134 and holes to flow toward the p-type layers 110, 130 creating a current. In one embodiment, the first p-i-n junction 116 comprises an intrinsic type amorphous silicon layer 112 and the second p-i-n junction 136 comprises an intrinsic type microcrystalline silicon layer 132 since amorphous silicon and microcrystalline silicon absorb different wavelengths of the solar radiation 101. Therefore, the formed solar cell 200 is more efficient, since it captures a larger portion of the solar radiation spectrum. The intrinsic layer 112, 132 of amorphous silicon and the intrinsic layer of microcrystalline are stacked in such a way that solar radiation 101 first strikes the intrinsic type amorphous silicon layer 112 and then strikes the intrinsic type microcrystalline silicon layer 132 since amorphous silicon has a larger bandgap than microcrystalline silicon. In a case where a WSR layer 150 is present, the solar radiation that is not absorbed by the first p-i-n junction 116 and is transmitted through the WSR layer 150 will continue on to the second p-i-n junction 136.

Antireflective Coating Layer

Figure 3:
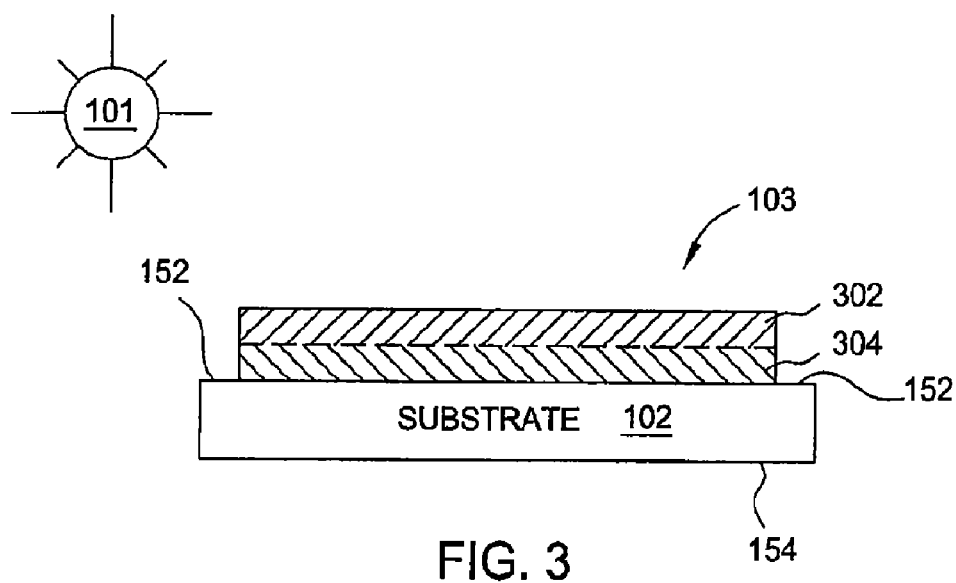
FIG. 3 is a magnified view of an antireflective coating (ARC) layer disposed on a first surface of a substrate according to one embodiment of the invention.

FIG. 3 depicts a magnified view of the antireflective coating (ARC) layer 103 disposed on the first surface 152 of the substrate 102 according to one embodiment of the invention. As discussed above, the ARC layer 103 is selected to have a refractive index between the refractive index of air and the refractive index of the substrate 102. In one embodiment, the ARC layer 103 is selected to have a refractive index between about 1.1 and 1.4. In one embodiment, the ARC layer 103 may be fabricated by a spray coating technique to spray a chemical solution on the first surface 152 of the substrate 102. Subsequently, a baking process is performed to dry out and cure the chemical solution sprayed on the first surface 152 of the substrate 102. The cured and/or dried out chemical is then formed a thin layer of ARC layer 103 with desired film composition on the substrate 102. In one embodiment, the temperature of the cure/drying process is controlled at a relatively low temperature, such as lower than 200 degrees Celsius, to drive out the excess moisture and water contained in the chemical solution. In one embodiment, the temperature of the cure/drying process is controlled at about less 100 degrees Celsius.

In one embodiment, the chemical solution, which is sprayed on the first surface 152 of the substrate 102, includes silane, fluorine (F) and carbon (C) that are dissolved in an aqueous solution. It is believed that the addition of fluorine (F) in the chemical solution may affect the transmittance of the resultant ARC layer 103 formed on the substrate 102. Accordingly, by actively controlling the concentration of the different elements in the chemical solution, such as the fluorine or carbon elements, the transmittance and film refractive index may be adjusted to form a desirable ARC layer 103. In one embodiment, the chemical solution used to form the ARC layer 103 may include between about 40 percent by volume and about 79 percent by volume of silane, between about 20 percent by volume and about 59 percent by volume of fluorine, and about less than 1 percent by volume of carbon dissolved in water. It is noted that the water described herein may include any forms of water, including D.I. water, steamed water, pure water, of any suitable water. In one example, the fluorine concentration in the chemical solution is achieved by adding a solution containing hydrofluoric acid (HF) and the carbon and silicon concentration is achieved by adding a solution containing alkylsilane.

After the ARC layer 103 is formed on the substrate 102, the surface of the ARC layer 103 may be polished or surface finished to provide a film surface with desired film roughness. It is believed that a surface with a desirable roughness may assist in trapping light that can be delivered through the substrate 102 to the solar cell junctions formed thereon. In one embodiment, the surface of the ARC layer 103 may be CMP polishing with a polishing fluid including $CeO_2$ or $Al_2O_3$. Alternatively, the surface of the ARC layer 103 may be mechanically abraded and/or polished by any suitable manner available in the art. In one embodiment, the ARC layer 103 is surface finished to have an average film roughness of about 50 Ra.

In another embodiment, the ARC layer 103 may be formed on the first surface 152 of the substrate 102 by a PVD, CVD, or other suitable deposition techniques. Accordingly, the ARC layer 103 may comprise an inorganic film layer having a desired film transmittance and refractive index that can assist in the transmission of light through the substrate 102 to the solar cell junctions 116, 136 formed on the substrate 102. In one embodiment, the ARC layer 103 may contain a titanium oxide ($TiO_2$) layer, a tin oxide layer ($SnO_2$), silicon oxide ($SiO_2$) or combinations thereof, which are formed on the first surface 152 of the substrate 102. In another embodiment, the ARC layer 103 may be a composite layer having one or more layers formed on the first surface 152 of the substrate 102. In one embodiment, the ARC layer 103 may be a film stack include a first layer 302 formed on a second layer 304, which is formed on the substrate 102, as shown in FIG. 3. In one embodiment, the first layer 302 may be a silicon oxide layer ($SiO_2$) and the second layer 304 is a titanium oxide ($TiO_2$) layer or a tin oxide layer ($SnO_2$) or vise versa. In one embodiment, the first layer 302 formed in the ARC layer 103 is a silicon oxide layer ($SiO_2$) and the second layer 304 is a titanium oxide ($TiO_2$) layer. In another embodiment, the ARC layer 103 may include a film stack containing repeated silicon oxide ($SiO_2$) and titanium oxide ($TiO_2$) layers. For example, the ARC layer 103 may include a film stack having a first pair of a first silicon oxide ($SiO_2$) layer and a first titanium oxide ($TiO_2$) layer and a second pair having a second silicon oxide layer ($SiO_2$) and a second titanium oxide ($TiO_2$) layer consecutively formed on the substrate 102. It is noted that the first layer of silicon oxide layer (SiO$_2$) and the second layer of titanium oxide (TiO$_2$) layer may be repeatedly formed as many times as needed.

In one embodiment, the first layer 302 is a silicon oxide layer (SiO$_2$) that has a thickness of about 20 nm and the second layer 304 is a titanium oxide (TiO$_2$) layer that has a thickness of about 10 nm fabricated by a PVD process. In another embodiment, the overall thickness of the ARC layer 103 may be controlled at between about 30 nm and about 3000 nm, such as about 50 nm and about 1000 nm. As discussed above, the ARC layer 103 utilizing this composite film stack may have a refractive index between about 1.1 and 1.4.

Barrier Layer

Figure 4:
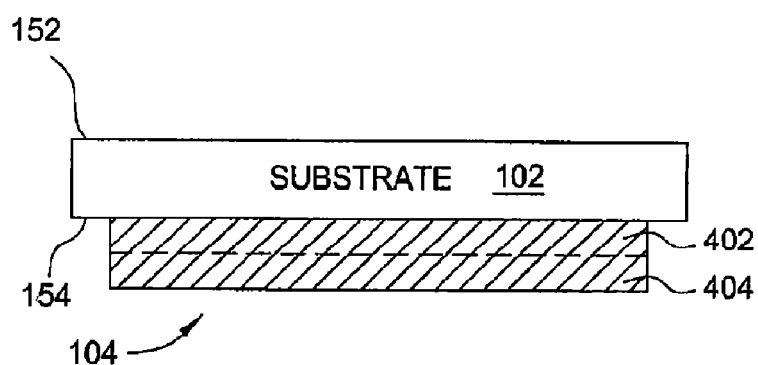
FIG. 4 is a magnified view of a barrier layer disposed on a surface of a second surface of a substrate according to one embodiment of the invention.

FIG. 4 depicts a magnified view of the barrier layer 104 disposed on the second surface 154 of the substrate 102 according to one embodiment of the invention. As discussed above, the barrier layer 104 may provide similar functions as the ARC layer 103, since it is generally intended to improve the transmission of light to the junctions 116, 136. In general, the barrier layer 104 is configured to have good adhesion between the substrate 102 and the first transparent conductive oxide (TCO) layer 106, have a good electrical conductivity, and also act as a barrier to prevent any contaminants (e.g., sodium (Na)) found in the substrate 102 from diffusing into the TCO layer 106 and junctions 116, 136 during subsequent processing, which can affect the efficiency of the formed solar cell device. The barrier layer 104 is selected from a material that has high film transparency, high light scattering, high film conductivity, high electrical mobility and sufficient barrier properties (e.g., density) to inhibit the movement of mobile contaminants.

In one embodiment, the barrier layer 104 may be a titanium oxide (TiO$_2$) layer, a tin oxide layer (SnO$_2$), aluminum oxide layer (Al$_2$O$_3$), or combinations thereof. In another embodiment, the barrier layer 104 may be a silicon containing layer, such as silicon oxide layer, silicon nitride layer, silicon oxynitride layer or the combinations thereof. Different dopants, such as iron (Fe), chromium (Cr), aluminum (Al) or other suitable elements, may be doped into the barrier layer 104 to improve the films transparency and conductivity. In one embodiment, the barrier layer 104 is a tin oxide layer (SnO$_2$), an iron doped a tin oxide layer (SnO$_2$:Fe), a titanium oxide layer (TiO$_2$), an iron doped titanium oxide layer (TiO$_2$:Fe), an aluminum oxide layer (Al$_x$O$_y$) or any other suitable materials. In an exemplary embodiment depicted in FIG. 4, the barrier layer 104 may be a composite film having a first layer 404 formed on a second layer 402. In one embodiment, the first layer 404 may be a titanium oxide (TiO$_2$) layer and the second layer 402 may be a tin oxide layer (SnO$_2$). In another embodiment, the first layer 404 may be a silicon oxide (SiO$_2$) layer and the second layer 402 may be a tin oxide layer (SnO$_2$). In yet embodiment, the first layer 404 may be a tin oxide (SnO$_2$) layer and the second layer 402 may be a titanium oxide (TiO$_2$) layer. In yet another embodiment, the first layer 404 may be a silicon oxide layer (SiO$_2$) and the second layer 402 may be a silicon oxynitride (SiON) layer, or silicon oxide layer. The barrier layer 104 may have a thickness between about 100 Å and about 600 Å, such as between about 200 Å and about 400 Å.

Back Metal Electrode Layer(s)

Figure 5:
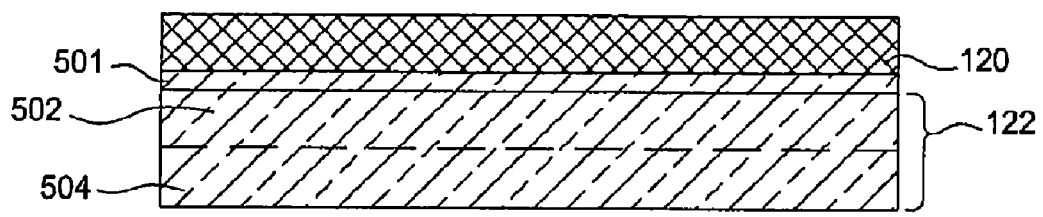
FIG. 5 is a magnified view of a back metal electrode formed in a solar cell disposed on a substrate according to one embodiment of the invention.

FIG. 5 depicts a magnified view of the back metal electrode 122 disposed on the second TCO layer 120, according to one embodiment of the invention. FIG. 5 only depicts the back metal electrode 122 and the second TCO layer 120 formed in the solar cells 100, 200 for ease of description. The back metal electrode 122 assists in the reflection of light back to the solar cell junctions 116, 136 so as to improve current collection and generation. The back metal electrode 122 may include, but not limited to, a material selected from the group consisting of Al, Ag, Ti, Cr, Au, Cu, Pt, alloys thereof, or combinations thereof. In one particular embodiment, the back metal electrode 122 may be a silver (Ag) layer having different doped formed therein. Suitable dopants that may be doped into the silver layer includes silicon (Si), palladium (Pd), or other suitable elements. The dopants, such as silicon or palladium, may have a concentration controlled between about 0.1 weight percent and about 10 weight percent, such as between 0.15 weight percent and about 7 weight percent in the formed silver (Ag) containing layer. In one embodiment, the doped silver (Ag) layer may be formed by a PVD process that uses a silver target having a desired concentration of a dopant material disposed therein. In this case, the target used in the PVD process may be selected from a silver based target having a concentration of silicon (Si) of between about 0.1 weight percent and about 10 weight percent. Similarly, in the embodiment wherein the back metal electrode 122 is configured to form as a palladium doped silver layer (Ag:Pd), the target utilized in the PVD process may be selected from a silver based target having a palladium element doped therein with a concentration between about 0.1 weight percent and about 10 weight percent. It is believed that a back metal electrode 122 formed from a silver palladium alloy (Ag:Pd) will be highly reflective at wavelengths between 500 and 1100 nm, such as 0%, while also supplying improved adhesive properties versus pure silver and the other silver silicon alloys. In one example, a palladium doped silver layer (Ag:Pd) that has a concentration between about 0.25 and about 7 weight percent is able to achieve a reflectivity of 90%.

In one embodiment, the back metal electrode 122 may be in form of a composite layer having a first layer 502 and a second layer 504 disposed on the first layer 502, as shown in FIG. 5. An additional interface layer 501 may be disposed between the first layer 502 of the back metal electrode 122 and the second TCO layer 120 to improve interface adhesion so that the subsequently formed first layer 502 of the back metal electrode 122 will reliably adhere to the second TCO layer 120. In one embodiment, the additional interface layer 501 may be a thin chromium (Cr) layer having a thickness controlled at less than 50 Å, such as about less than 20 Å. In one embodiment, as depicted in FIG. 5, the back metal electrode 122 includes the first layer 502 fabricated from a silicon (Si) or palladium (Pd) doped silver (Ag) layer and the silicon or palladium dopant concentration is controlled to about 0.25 weight percent and have a thickness between about 300 Å and about 2500 Å, such as less than 1500 Å. The second layer 504 is fabricated from a nickel vanadium (NiV) alloy having a thickness between about 300 Å and about 2500 Å, such as less than 1500 Å. Other films, materials, substrates, and/or packaging may be provided over back metal electrode 122 to complete the solar cell device. The formed solar cells may be interconnected to form solar cells, or solar cell modules, which in turn can be connected to form solar cell arrays, which are typically formed by use of a scribing process. An example of a process of forming interconnected solar cells on a substrate is further described in the U.S. patent application Ser. No. 12/483,948, filed Jun. 12, 2009, which is incorporated herein by reference in its entirety.

Solar Cell Active Regions

Referring back to FIGS. 1 and 2, prior to the deposition of the p-type amorphous silicon layer 110, a heavily doped heavily doped or degenerately doped amorphous silicon layer (e.g., reference numeral 109) may be formed on the conductive contact layer 108. It is believed that degenerate doping improves charge collection by providing low-resistance contact, or Ohmic type contact. Degenerate doping is also believed to improve conductivity of the amorphous silicon layer. Details description and examples of the heavily doped heavily doped or degenerately doped amorphous silicon layer or microcrystalline silicon layer 109 is disclosed in U.S. application Ser. No. 12/481,175 filed on Jun. 9, 2009 by Sheng et al., which is herein incorporated by reference in its entirety. The charge collection attributes of layer 109 is generally provided by the use of doped semiconductor layers, such as silicon layers doped with p-type or n-type dopants. P-type dopants are generally Group III elements, such as boron or aluminum. N-type dopants are generally Group V elements, such as phosphorus, arsenic, or antimony. In most embodiments, boron is used as the p-type dopant and phosphorus as the n-type dopant. These dopants may be added to the p-type and n-type layers 110, 130, 114, 134 described above by including boron-containing or phosphorus-containing compounds in the reaction mixture. Suitable boron and phosphorus compounds generally comprise substituted and unsubstituted lower borane and phosphine oligomers. Some suitable boron compounds include trimethylboron ($B(CH_3)_3$ or TMB), diborane ($B_2H_6$), boron trifluoride ($BF_3$), and triethylboron ($B(C_2H_5)_3$ or TEB). Phosphine is the most common phosphorus containing compound. The dopants are generally provided with carrier gases, such as hydrogen, helium, argon, and other suitable gases. If hydrogen is used as the carrier gas, the total hydrogen in the reaction mixture comprises both hydrogen gas and hydrogen provided in the carrier gas. Thus hydrogen ratios will include the hydrogen used as a carrier gas for dopants.

Dopants will generally be provided as dilute gas mixtures in an inert gas. For example, dopants may be provided at molar or volume concentrations of about 0.5% in a carrier gas. If a dopant is provided at a volume concentration of 0.5% in a carrier gas flowing at 1.0 sccm/L, the resultant dopant flow rate will be 0.005 sccm/L. Dopants may be provided to a reaction chamber at flow rates between about 0.0002 sccm/L and about 0.1 sccm/L depending on the degree of doping desired.

In one embodiment, the layer 109 is a degeneratively-doped p-type amorphous silicon layer (e.g., heavily doped p-type amorphous silicon, $p^{++}$ layer). The degenerately (e.g., heavily) doped $p^{++}$-type amorphous silicon layer may have a Group III element doping concentration that is higher than the p-type amorphous silicon layer 110. The degenerately doped $p^{++}$-type amorphous silicon layer has a doping concentration equivalent to a layer formed using TMB and silane at a flow rate ratio by volume between about 2:1 and about 6:1 at a pressure of between about 2 and about 2.5 Torr, where the TMB precursor comprises 0.5% molar or volume concentration of TMB. The degenerately (e.g., heavily) doped $p^{++}$-type amorphous silicon layer is formed at a plasma power between about 45 milliwatts/cm² (2400 Watts) and about 91 milliwatts/cm² (4800 Watts). In one example, the degenerately doped $p^{++}$-type amorphous silicon layer may be formed by providing silane at a flow rate of between about 2.1 sccm/L (e.g., 6000 sccm) about 3.1 sccm/L (e.g., 9000 sccm), hydrogen gas at a flow rate so that the hydrogen gas to silane gas mixture ratio is about 6.0, a doping precursor at a TMB gas (e.g., 0.5% molar or volume concentration of TMB) to silane gas mixture flow rate ratio by volume of 6:1, while the substrate support temperature is maintained at about 200° C., the plasma power is controlled between about 57 milliwatts/cm² (3287 Watts) and the chamber pressure is maintained at about 2.5 Torr for about 2-10 seconds to form about a 10-50 Å film, such as a 20 Å film. In one embodiment, the heavily doped amorphous silicon layer has a Group III element dopant concentration formed in the amorphous silicon layer between about $10^{20}$ atoms/cm³ and about $10^{21}$ atoms/cm³.

In one embodiment, the degeneratively-doped $p^{++}$-type amorphous silicon layer may be formed as a heavily doped p-type amorphous silicon carbide layer. The carbon elements may be provided by supplying a carbon containing gas into the gas mixture while forming the heavily doped $p^{++}$-type amorphous silicon carbide layer. In one embodiment, the addition of methane or other carbon containing compounds, such as $CH_4$, $C_3H_8$, $C_4H_{10}$, or $C_2H_2$, can be used to form the heavily doped p-type amorphous silicon carbide layer 109 that absorbs less light than other silicon containing materials. It is believed the addition of carbon to the degeneratively-doped $p^{++}$-type amorphous silicon layer will improve the transparency of the film so that less light will be absorbed during use, thereby improving the conversion efficiency of the solar cell. In one embodiment, the carbon concentration in the heavily doped $p^{++}$-type amorphous silicon carbide layer is controlled to a concentration between about 1 atomic percent and about 50 atomic percent. In one embodiment, the heavily doped $p^{++}$-type amorphous silicon carbide layer has a thickness between about 20 Å and about 300 Å, such as between about 10 Å and about 200 Å, for example between about 20 Å and about 100 Å.

In one embodiment, the heavily doped $p^{++}$-type layer is a heavily doped p-type amorphous silicon layer and the p-type amorphous silicon layer 110, subsequently formed thereon, may be configured as a p-type amorphous silicon layer or a p-type amorphous silicon carbide layer. In another embodiment wherein the heavily doped $p^{++}$-type layer is formed as a heavily doped amorphous silicon carbide layer, the p-type amorphous silicon layer 110 subsequently formed thereon may be configured as a p-type amorphous silicon carbide layer. Details description and examples of the heavily doped heavily doped or degenerately doped amorphous silicon layer or microcrystalline silicon layer 109 is disclosed in U.S. application Ser. No. 12/481,175 filed on Jun. 9, 2009 by Sheng et al., which is incorporated by reference in its entirety.

After the degeneratively-doped doped $p^{++}$-type amorphous silicon layer is formed on the conductive contact layer 108, the p-type amorphous silicon layer 110 may be deposited by providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 5 sccm/L and 60 sccm/L. Trimethylboron may be provided at a flow rate between about 0.005 sccm/L and about 0.05 sccm/L. If trimethylboron is provided in a 0.5% molar or volume concentration in a carrier gas, then the dopant/carrier gas mixture may be provided at a flow rate between about 1 sccm/L and about 10 sccm/L. Additionally, a carbon containing gas may be supplied in the gas mixture to deposit p-type amorphous silicon layer 110 as well to form p-type amorphous silicon layer 110 as a carbon doped p-type amorphous silicon layer. Suitable examples of carbon containing gas include $CH_4$, $C_3H_8$, $C_4H_{10}$, or $C_2H_2$, or any suitable carbon containing gas. Carbon containing gas may be provided at a flow rate between about 0.001 sccm/L and about 5 sccm/L. Applying RF power between about 15 mWatts/cm² and about 200 mWatts/cm² at a chamber pressure between about 0.1 Torr and 20 Torr, for example between about 1 Torr and about 4 Torr, will deposit a p-type amorphous silicon layer 110 at about 100 Å/min or more. In one embodiment, the p-type amorphous silicon layer 110 may have a thickness between about 60 Å and about 300 Å. In one example, the p-type amorphous silicon layer 110 has a Group III element dopant concentration of between about $10^{18}$ atoms/cm$^3$ and about $10^{20}$ atoms/cm$^3$.

After the p-type amorphous silicon layer 110 is formed on the substrate 102, the barrier layer, such as the interface barrier layer 111 depicted in FIGS. 1 and 2, may be formed on the p-type amorphous silicon layer 110. It is noted that the interface barrier layer 111 may be formed within the same chamber in which the p-type amorphous silicon layer 110 is formed. It is noted that the interface barrier layer 111 may also be formed within the same chamber in which the subsequent intrinsic type amorphous silicon layer 112 is formed. Alternatively, the interface barrier layer 111 may be formed in any suitable deposition chamber, such as a separate stand-alone CVD or PVD deposition chamber, as needed.

In one embodiment, the interface barrier layer 111 has a dopant, such as carbon, nitrogen, or other suitable elements, disposed therein. In one embodiment, the interface barrier layer 111 is formed as a carbon containing silicon containing layer. For example, the interface barrier layer 111 is formed as a carbon doped amorphous silicon layer, such as a silicon carbide layer (SiC). The interface barrier layer 111 serves as a cap layer and/or barrier layer that prevents the dopants, such as boron, in the underlying p-type amorphous silicon layer 110 from diffusing into the nearby adjacent layers during the subsequent deposition processes, thereby reducing the likelihood of contaminating or damaging the film layers and the solar cell devices formed on the substrate 102. It is believed that the carbon element formed in the interface barrier layer 111 can efficiently strengthen the silicon bonding microstructures with stronger silicon-carbon (Si—C) bonds formed therein, thereby providing a robust bonding network and thus preventing impurities and dopants from diffusion to the adjacent film layers. Boron diffusion is believed to be aided by certain defects, such as dangling bonds formed in amorphous silicon, or interstitials in crystalline silicon layers. Accordingly, carbon element formed in the interface barrier layer 111 may act as trap sties to capture boron elements so as to slow down or eliminate the boron diffusion.

Furthermore, the interface barrier layer 111 can be a carbon rich film that is stable enough to withstand the high temperature or plasma processing environments used to form or alter portions of the solar cell in the subsequent process steps. The carbon rich interface barrier layer 111 also provides manufacture flexibility to offset minor structure changes from the underlying p-type layer 110 so that the addition of the interface barrier layer 111 in the solar cell structure will only produces negligible series resistance increase. Details and examples of the optional interface barrier layer 111 and the low film bandgap intrinsic type amorphous silicon layer 112 are disclosed in U.S. application Ser. No. 12/582,323 filed on Oct. 20, 2009 by Sheng et al. which is herein incorporated by reference in its entirety. In one embodiment, the interface barrier layer 111 may be deposited by providing a gas mixture includes at least a carbon containing gas and a silicon containing gas. Suitable examples of carbon containing gas include $CH_4$, $C_3H_8$, $C_4H_{10}$, or $C_2H_2$, or any suitable carbon containing gas. Suitable examples of the silicon containing gas include silane ($SiH_4$), disilane ($Si_2H_6$), silicon tetrafluoride ($SiF_4$), silicon tetrachloride ($SiCl_4$), dichlorosilane ($SiH_2Cl_2$), combinations thereof and the like. In an exemplary embodiment, the carbon containing gas used to deposit the interface barrier layer 111 is $CH_4$ and the silicon containing gas used to deposit the barrier layer is $SiH_4$. The $CH_4$ gas supplied in the gas mixture has a ratio to silane gas of about 0.5:1 or less. Silane gas may be provided at a flow rate between about 1 sccm/L and about 10 sccm/L. The RF power is applied between about 15 mWatts/cm$^2$ and about 200 mWatts/cm$^2$ to the processing chamber. The chamber pressure is maintained between about 0.1 Torr and 20 Torr, such as between about 1 Torr and about 4 Torr. In one embodiment, the barrier layer 111 is formed to have a thickness between about 1 Å and about 200 Å, such as about 10 Å and about 25 Å, for example, about 20 Å.

In one embodiment, in which the interface barrier layer 111 and the p-type amorphous silicon layer 110 are formed in the same chamber, the gas mixture supplied to the processing chamber may be varied to deposit different layers on the substrate during the different deposition process steps. For example, in one embodiment, the gas mixture supplied to deposit the p-type amorphous silicon layer 110 may include at least a silicon containing gas, a carbon containing gas, and a Group III containing gas while the gas mixture supplied to deposit the interface barrier layer 111 may include at least a silicon containing gas and a carbon containing gas.

In one embodiment, during the deposition of the p-type amorphous silicon layer 110 and the interface barrier layer 111 in the same chamber, the gas mixture supplied to the processing chamber may initially include the silicon containing gas, Group III containing gas, and the carbon containing gas. After the p-type amorphous silicon layer 110 has reached a desired thickness on the substrate 102, the Group III containing gas supplied in the gas mixture may subsequently turned off to deposit the interface barrier layer 111 on the substrate without breaking vacuum. The gas species supplied in the gas mixture may be smoothly switched and transitioned to deposit the p-type amorphous silicon layer 110 and the interface barrier layer 111 can have a graded interface. In this example, the material layers can be deposited on the substrate 102 in a single chamber without having to be transferred between different chambers. It is noted that the gas flow rate may be varied as need to deposit each of the layers.

After the interface barrier layer 111 is formed on the substrate 102, the intrinsic type amorphous layer 112 (FIGS. 1-2) is then formed on the interface barrier layer 111. The intrinsic type amorphous silicon layer 112 is formed under a process condition having a relatively high temperature, a relatively low pressure, and a relatively low hydrogen dilution ratio (e.g., low $H_2/SiH_4$ ratio). The relatively high temperature, relatively low pressure, relatively low hydrogen dilution ratio (e.g., low $H_2/SiH_4$ ratio) process condition described herein results in an intrinsic type amorphous silicon layer 112 having relatively lower film bandgap that absorbs a broader light spectrum and improves the solar cell's conversion efficiency. It is believed that the relatively high temperature used during the deposition process may assist in producing smaller bandgap films that have a low defect density and high current generation, which may advantageously improve the overall conversion efficiency of the solar cell junction. In one embodiment, it is believed that the processes described herein can be used to reduce the band gap of the amorphous silicon layer 112 to between about 1.70 eV and about 1.75 eV versus more conventionally formed amorphous silicon layers that typically have a band gap of about 1.78 eV. Preferably, the band gap of the formed amorphous silicon layer 112 is between about 1.70 eV and about 1.72 eV. Therefore, using the deposition techniques described herein, the formed amorphous silicon layer can deliver about a 5% reduction in the effective band gap as measured using the Tauc method. In one embodiment, the deposition temperature is controlled at a range greater than 200 degrees Celsius, such as between about 220 degrees Celsius and about 300 degrees Celsius, for example, between about 220 degrees Celsius and about 250 degrees Celsius. In certain circumstances, the use of a high temperature deposition process could cause dopants in the p-type amorphous silicon layer 110 to diffuse into the intrinsic type amorphous silicon layer 112 or adjacent film layers during the subsequent deposition process(es). Accordingly, by adding the interface barrier layer 111 disposed between the p-type amorphous silicon layer 110 and the intrinsic type amorphous silicon layer 112, the interface barrier layer 111 can be used to suppress the dopant diffusion into the intrinsic type amorphous silicon layer 112, thereby maintaining the purity and desired properties of the intrinsic type amorphous silicon layer 112.

Furthermore, the relatively low deposition pressure used to form the intrinsic type amorphous silicon layer 112, such as less than 2.5 Torr, may also assist in depositing a layer that has good optoelectronic and microstructural properties and having less cluster phase hydrogen formed in the resultant amorphous silicon film, leading to a smaller bandgap and improved electrical properties in the formed film layer. It is believed that higher cluster phase hydrogen formed in the resultant film may increase the crystallinity of the resultant film, thereby reducing the likelihood of forming the resultant film as an amorphous silicon layer. In one embodiment, the process pressure controlled during the deposition is less than about 2.5 Torr, such as about less than 2 Torr, such as about 0.1 Torr and about 1.8 Torr, for example, about 1 Torr and about 1.5 Torr. An RF power between about 15 milliWatts/cm$^2$ and about 250 milliWatts/cm$^2$ may be provided to the processing chamber.

Additionally, the relatively low hydrogen dilution supplied in the gas mixture for depositing the intrinsic type amorphous silicon layer 112 may also assist in depositing an intrinsic type amorphous silicon layer 112 that has a smaller bandgap. It is believed that lower hydrogen gas flow during the deposition process will reduce the hydrogen content in the formed intrinsic type amorphous silicon layer, thereby reducing the chance of forming crystalline regions in the amorphous silicon layer 112, thus tending to produce an amorphous film, instead of microcrystalline silicon film. A smaller bandgap amorphous silicon layer may be produced by the positioning of hydrogen atoms in amorphous silicon states of the intrinsic type amorphous silicon layer 112. The amorphous silicon layers may assist obtaining light at a longer wavelength, thereby increasing current generation in the junction cells. In one embodiment, the hydrogen to silane ratio ($H_2/SiH_4$) supplied in the gas mixture is controlled to a level of about less than 10, such as less than 6, for example between about 2 and about 5. Alternatively, silane gas supplied in the gas mixture may be controlled at a flow rate between about 1 sccm/L and about 10 sccm/L. Hydrogen gas may be controlled at a flow rate between about 2 sccm/L and 100 sccm/L. An optional carrier gas, or inert gas, such as Ar and He or the like, may also be supplied into the gas mixture if necessary. In the embodiment wherein the carrier gas or inert gas is supplied into the processing chamber, the gas flow rate of the carrier gas or inert gas may be controlled at between about 2 sccm/L and about 100 sccm/L.

Accordingly, by providing a relatively high deposition temperature, relatively low deposition pressure, and a low hydrogen dilution ratio during the deposition process, an intrinsic amorphous silicon film 112 with low film bandgap can be obtained. Furthermore, by adding the interface barrier layer 111 between the p-type amorphous silicon layer 110 and the intrinsic type amorphous silicon layer 112, the interface barrier layer 111 can be used to prevent the dopants contained in the p-type amorphous silicon layer 110 from diffusing into the adjacent and/or upper intrinsic type amorphous silicon layer 112, thereby forming an intrinsic type amorphous silicon layer 112 that has a desirable purity, electrical properties and optical properties. Therefore, the high temperature process used to form the intrinsic type amorphous silicon layer will not damage or destroy the film properties or device performance of a formed solar cell, which would normally be found in conventionally formed devices. By use of the aforementioned intrinsic type amorphous silicon deposition process and barrier layer formation process, the formed amorphous silicon based solar cell junction can efficiently convert longer wavelengths of light, even after correcting for light induced degradation (LID) by prolonged light-soaking, thereby improving the overall device performance and solar cell device conversion efficiency.

In one embodiment, the intrinsic type amorphous silicon layer 112 may be formed to a thickness between about 1,500 Å and about 4,500 Å, such as between about 2,000 Å and about 4,000 Å, for example about 3000 Å and about 3500 Å. It is believed that the intrinsic type amorphous silicon layer 112 with a higher thickness, such as greater than 2800 Å, may have increase light absorption in the intrinsic type amorphous silicon layer 112, thereby retaining light in the intrinsic type amorphous silicon layer 112 for a longer time for higher current generation. In one embodiment, the intrinsic type amorphous silicon layer 112 may be formed to a thickness between about 3,000 Å and about 3,500 Å.

After the intrinsic type amorphous silicon layer 112 is formed on the interface barrier layer 111, the n-type microcrystalline silicon layer 114 (FIGS. 1-2) is formed on the intrinsic type amorphous silicon layer 112. In one embodiment, the n-type microcrystalline silicon layer 114 may be deposited by providing a gas mixture of hydrogen gas to silane gas in a ratio of about 100:1 or more, such as about 500:1 or less, such as between about 150:1 and about 400:1, for example about 304:1 or about 203:1. Silane gas may be provided at a flow rate between about 0.1 sccm/L and about 0.8 sccm/L, such as between about 0.32 sccm/L and about 0.45 sccm/L, for example about 0.35 sccm/L. Hydrogen gas may be provided at a flow rate between about 30 sccm/L and about 250 sccm/L, such as between about 68 sccm/L and about 143 sccm/L, for example about 71.43 sccm/L. Phosphine may be provided at a flow rate between about 0.0005 sccm/L and about 0.006 sccm/L, such as between about 0.0025 sccm/L and about 0.015 sccm/L, for example about 0.005 sccm/L. In other words, if phosphine is provided in a 0.5% molar or volume concentration in a carrier gas, then the dopant/carrier gas may be provided at a flow rate between about 0.1 sccm/L and about 5 sccm/L, such as between about 0.5 sccm/L and about 3 sccm/L, for example between about 0.9 sccm/L and about 1.088 sccm/L. Applying RF power between about 100 mW/cm$^2$ and about 900 mW/cm$^2$, such as about 370 mW/cm$^2$, at a chamber pressure of between about 1 Torr and about 100 Torr, for example between about 3 Torr and about 20 Torr, such as between 4 Torr and about 12 Torr, for example about 6 Torr or about 9 Torr, will deposit an n-type microcrystalline silicon layer having a crystalline fraction between about 20 percent and about 80 percent, for example between 50 percent and about 70 percent, at a rate of about 50 Å/min or more, such as about 150 Å/min or more.

In one embodiment, one or more elements may be added to n-type microcrystalline silicon layer 114, such as carbon atoms by supplementing the reactant gas mixture with sources of carbon to form an n-type microcrystalline silicon carbide (mc-SiC) layer. For example, carbon may be added to the film by adding a carbon source, such as methane ($CH_4$), $C_3H_8$, $C_4H_{10}$, or $C_2H_2$, to the gas mixture while forming the n-type microcrystalline silicon layer 114. In general, most $C_1$-$C_4$ hydrocarbons may be used as carbon sources. In one embodiment, the n-type silicon carbide layer formed for the n-type microcrystalline silicon layer 114 may have between about 1 atomic % and about 50 atomic % carbon. The quantity of secondary components may be adjusted by adjusting the ratios of precursor gases in the processing chamber. The ratios may be adjusted in steps to form layered structures, or continuously to form a single layer having a graded composition. In one embodiment, the ratio of the carbon containing gas flow, such as the methane ($CH_4$) gas flow, to silane flow rate is between about 0 and about 0.5, such as between about 0.20 and about 0.35, for example about 0.25. The ratio of methane gas to silane in the feed may be varied to adjust the amount of carbon in the deposited n-type microcrystalline silicon layer 114.

It is believed that the carbon atoms disposed in the n-type microcrystalline silicon layer will allow a highly conductive layer to be formed that has an adjustable bandgap and refractive index. Microcrystalline silicon carbide, for example, can develop a layer that has a crystalline fraction above 60%, a bandgap width above 2 electron volts (eV), and conductivity greater than 0.1 siemens per centimeter (S/cm). The bandgap and refractive index can be adjusted by varying the ratio of methane to silane in the reaction mixture. In one embodiment, the ratio of methane gas flow rate to silane flow rate is between about 0 and about 0.5, such as between about 0.20 and about 0.35, for example about 0.25. Moreover, it can be deposited at rates of 150-200 Å/min with thickness variation less than 10%. The adjustable refractive index allows formation of a reflective layer that is highly conductive with wide bandgap, resulting in improved current and fill factor. Details description and examples of the doped n-type microcrystalline silicon layer 114 is disclosed in U.S. application Ser. No. 12/208,478 filed on Sep. 11, 2008 by Sheng et al., U.S. Application Ser. No. 61/139,390 filed on Dec. 19, 2008 by Sheng et al., which are incorporated by reference in their entirety.

Referring now to FIG. 2, after the first p-i-n junction 116, and the optional WSR layer 150, is formed on the substrate 102, the second p-i-n junction 136 is subsequently formed on the first p-i-n junction 116 and/or the WSR layer 150. The second p-i-n junction 136 includes the p-type microcrystalline silicon layer 130, the intrinsic type microcrystalline silicon layer 132, and the n-type amorphous silicon layer 134. In one embodiment, the p-type microcrystalline silicon layer 130 may be deposited by providing a gas mixture of hydrogen gas and silane gas in ratio of hydrogen-to-silane of about 200:1 or greater, such as 1000:1 or less, for example between about 250:1 and about 800:1, and in a further example about 601:1 or about 401:1. Silane gas may be provided at a flow rate between about 0.1 sccm/L and about 0.8 sccm/L, such as between about 0.2 sccm/L and about 0.38 sccm/L. Hydrogen gas may be provided at a flow rate between about 60 sccm/L and about 500 sccm/L, such as about 143 sccm/L. TMB may be provided at a flow rate between about 0.0002 sccm/L and about 0.0016 sccm/L, such as about 0.00115 sccm/L. If TMB is provided in a 0.5% molar or volume concentration in a carrier gas, then the dopant/carrier gas mixture may be provided at a flow rate between about 0.04 sccm/L and about 0.32 sccm/L, such as about 0.23 sccm/L. It has been found that by applying an RF power between about 50 mW/cm$^2$ and about 700 mW/cm$^2$, such as between about 290 mW/cm$^2$ and about 440 mW/cm$^2$, and maintaining the chamber pressure at between about 1 Torr and about 100 Torr, preferably between about 3 Torr and about 20 Torr, more preferably between 4 Torr and about 12 Torr, such as about 7 Torr or about 9 Torr, a p-type microcrystalline layer having crystalline fraction between about 20 percent and about 80 percent, preferably between 50 percent and about 70 percent for a microcrystalline layer can be deposited at a deposition rate of about 10 Å/min or more, such as about 143 Å/min or more.

After the p-type microcrystalline silicon layer 130 is formed on the substrate 102, the intrinsic type microcrystalline silicon layer 132 is then formed on the p-type microcrystalline silicon layer 130. The intrinsic type microcrystalline silicon layer 132 may be deposited by providing a gas mixture of silane gas and hydrogen gas in a ratio of hydrogen to silane between about 20:1 and about 200:1. Silane gas may be provided at a flow rate between about 0.5 sccm/L and about 5 sccm/L. Hydrogen gas may be provided at a flow rate between about 40 sccm/L and about 400 sccm/L. In certain embodiments, the silane flow rate may be ramped up from a first flow rate to a second flow rate during deposition. In certain embodiments, the hydrogen flow rate may be ramped down from a first flow rate to a second flow rate during deposition. Applying RF power between about 300 mW/cm$^2$ or greater, such as about 600 mW/cm$^2$ or greater, at a chamber pressure between about 1 Torr and about 100 Torr, for example between about 3 Torr and about 20 Torr, such as between about 4 Torr and about 12 Torr, will generally deposit an intrinsic type microcrystalline silicon layer having crystalline fraction between about 20 percent and about 80 percent, such as between 55 percent and about 75 percent, at a rate of about 200 Å/min or more, for example about 500 Å/min. In one embodiment, the deposited intrinsic type microcrystalline silicon layer has crystalline fraction between about 60 percent and about 65 percent and has a desired layer thickness, in an effort to balance out the decrease in deposition rate as the crystal fraction is increased and the lower required thickness of the formed i-layer as the crystal fraction is increased. In some embodiments, it may be advantageous to ramp the power density of the applied RF power from a first power density to a second power density during deposition.

In another embodiment, the intrinsic type microcrystalline silicon layer 132 may be deposited in multiple steps, each formed region having a different crystal fraction. In one embodiment, for example, the ratio of hydrogen to silane may be reduced in four steps from 100:1 to 95:1 to 90:1 and then to 85:1. In one embodiment, silane gas may be provided at a flow rate between about 0.1 sccm/L and about 5 sccm/L, such as about 0.97 sccm/L. Hydrogen gas may be provided at a flow rate between about 10 sccm/L and about 200 sccm/L, such as between about 80 sccm/L and about 105 sccm/L. In an exemplary embodiment wherein the deposition has multiple steps, such as four steps, the hydrogen gas flow may start at about 97 sccm/L in the first step, and be gradually reduced to about 92 sccm/L, 88 sccm/L, and 83 sccm/L respectively in the subsequent process steps. In the mean while, the hydrogen to silane ratio is controlled at 100:1, 95:1, 90:1 and 85:1 respectively in each process step. Applying RF power between about 300 mW/cm$^2$ or greater, such as about 490 mW/cm$^2$ at a chamber pressure between about 1 Torr and about 100 Torr, for example between about 3 Torr and about 20 Torr, such as between about 4 Torr and about 12 Torr, such as about 9 Torr, will result in deposition of an intrinsic type microcrystalline silicon layer at a rate of about 200 Å/min or more, such as 400 Å/min.

After the intrinsic type microcrystalline silicon layer 132 is formed on the p-type microcrystalline silicon layer 130, the n-type amorphous silicon layer 134 may be formed on the intrinsic type microcrystalline silicon layer 132. Alternatively, the n-type silicon layer 134 may be formed from a crystalline silicon based film having a crystalline fraction between about 20% and about 100%. In one embodiment wherein the n-type layer 134 is formed as an n-type amorphous silicon layer, the n-type amorphous silicon layer 134 may be deposited by providing a gas mixture containing a hydrogen gas to silane gas in a ratio of about 20:1 or less, such as about 5:5:1 or 7.8:1. Silane gas may be provided at a flow rate between about 0.1 sccm/L and about 10 sccm/L, such as between about 1 sccm/L and about 10 sccm/L, between about 0.1 sccm/L and 5 sccm/L, or between about 0.5 sccm/L and about 3 sccm/L, for example about 1.42 sccm/L or 5.5 sccm/L. Hydrogen gas may be provided at a flow rate between about 1 sccm/L and about 40 sccm/L, such as between about 4 sccm/L and about 40 sccm/L, or between about 1 sccm/L and about 10 sccm/L, for example about 6.42 sccm/L or 27 sccm/L. Phosphine may be provided at a flow rate between about 0.0005 sccm/L and about 0.075 sccm/L, such as between about 0.0005 sccm/L and about 0.0015 sccm/L or between about 0.015 sccm/L and about 0.03 sccm/L, for example about 0.0095 sccm/L or 0.023 sccm/L. If phosphine is provided in a 0.5% molar or volume concentration in a carrier gas, then the dopant/carrier gas mixture may be provided at a flow rate between about 0.1 sccm/L and about 15 sccm/L, such as between about 0.1 sccm/L and about 3 sccm/L, between about 2 sccm/L and about 15 sccm/L, or between about 3 sccm/L and about 6 sccm/L, for example between about 1.9 sccm/L or about 4.71 sccm/L. Applying RF power between about 25 mW/cm$^2$ and about 250 mW/cm$^2$, such as about 60 mW/cm$^2$ or about 80 mW/cm$^2$, at a chamber pressure between about 0.1 Torr and about 20 Torr, preferably between about 0.5 Torr and about 4 Torr, such as about 1.5 Torr, will deposit an n-type amorphous silicon layer 134 at a rate of about 100 Å/min or more, such as about 200 Å/min or more, such as about 300 Å/min or about 600 Å/min.

In the embodiment wherein the n-type silicon layer 134 is formed as the n-type microcrystalline silicon layer, the n-type microcrystalline silicon layer 134 may be formed by the process similar to or the same as the process described above utilized to form the n-type microcrystalline silicon layer 114 for the first p-i-n junction 116.

In one embodiment, one or more elements may be added to n-type amorphous or microcrystalline silicon layer 134, such as carbon atoms by supplementing the reactant gas mixture with a source of carbon to form a n-type microcrystalline/amorphous silicon carbide (mc-SiC or α-SiC) layer. For example, carbon may be added to the film by adding a carbon source, such as methane ($CH_4$), $C_3H_8$, $C_4H_{10}$, or $C_2H_2$, to the gas mixture while forming the n-type microcrystalline/amorphous silicon carbide (mc-SiC or α-SiC) layer 134. In general, most $C_1$-$C_4$ hydrocarbons may be used as carbon sources. In one embodiment, the n-type silicon carbide layer formed for the microcrystalline/amorphous silicon carbide (mc-SiC or α-SiC) layer 134 may have between about 1 atomic % and about 50 atomic % carbon. The quantity of secondary components may be adjusted by adjusting the ratios of precursor gases in the processing chamber. The ratios may be adjusted in steps to form layered structures, or continuously to form graduated single layers. In one embodiment, the ratio of the carbon containing gas flow, such as the methane ($CH_4$) gas flow, to silane flow rate is between about 0 and about 0.5, such as between about 0.20 and about 0.35, for example about 0.25. The ratio of methane gas to silane in the feed may be varied to adjust the amount of carbon in the deposited n-type microcrystalline/amorphous silicon carbide (mc-SiC or α-SiC) layer 134.

It should be noted that in many embodiments of the invention a pre-clean processes may be used to prepare substrates and/or reaction chambers for deposition of any of the above layers. A hydrogen or argon plasma pre-treat process may be performed to remove contaminants from the exposed surface of the substrate and/or chamber walls by supplying hydrogen gas or argon gas to the processing chamber between about 10 sccm/L and about 45 sccm/L, such as between about 15 sccm/L and about 40 sccm/L, for example about 20 sccm/L and about 36 sccm/L. In one example, the hydrogen gas may be supplied at about 21 sccm/L or the argon gas may be supplied at about 36 sccm/L. The treatment is accomplished by applying RF power between about 10 mW/cm$^2$ and about 250 mW/cm$^2$, such as between about 25 mW/cm$^2$ and about 250 mW/cm$^2$, for example about 60 mW/cm$^2$ or about 80 mW/cm$^2$ for hydrogen treatment and about 25 mW/cm$^2$ for argon treatment. In many embodiments it may be advantageous to perform an argon plasma pre-treatment process prior to depositing a p-type amorphous silicon layer, and a hydrogen plasma pre-treatment process prior to depositing other types of layers.

As discussed above, after the second p-i-n junction 136 is formed on the substrate 102, the conductive index matching layer 118, the second TCO layer 120, and the back metal electrode 122 is then consecutively formed thereon to complete the manufacture of the tandem junction solar cell 200 as depicted in FIG. 2.

EXAMPLES

Figure 6:
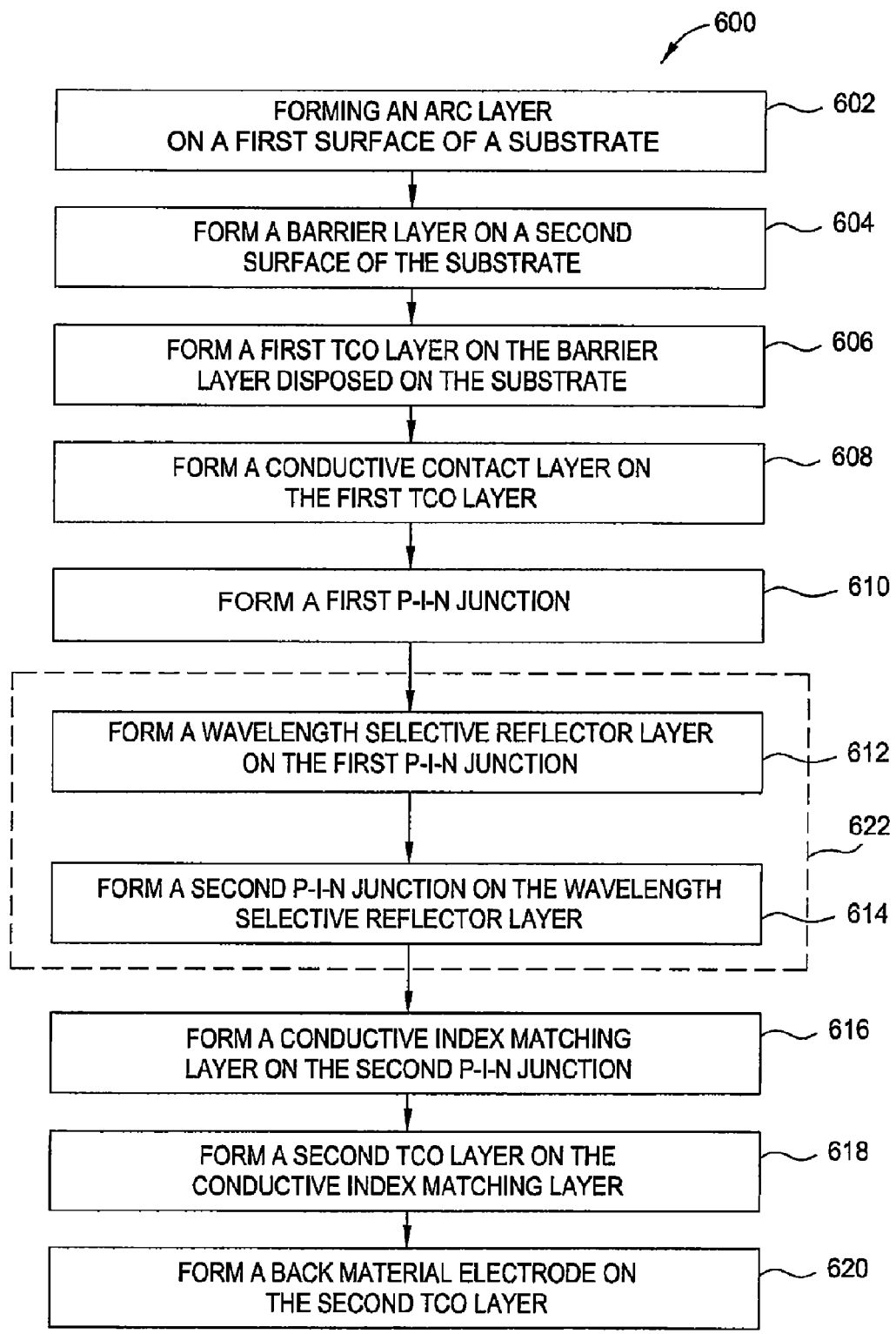
FIG. 6 is a process flow diagram of a method for manufacturing a solar cell on a substrate according to one embodiment of the invention.

FIG. 6 depicts is a process flow diagram of a method for manufacturing a solar cell on a substrate according to one embodiment of the invention. Similar to the structures discussed above with referenced to FIGS. 1 and 2, the process sequence 600 begins at step 602 in which an ARC layer is formed on a surface of a substrate 102. In one embodiment, step 602 is performed using one or more of the process steps used to form an ARC that is described above. In one embodiment, the ARC layer is formed during the glass manufacturing process, and thus step 602 includes providing a substrate, such as the substrate 102, having the ARC layer 103 formed thereon into a solar cell production line, such as the production line 900 depicted below with referenced to FIG. 9. In one embodiment, the ARC layer 103 is a fluorine and carbon containing silicon based material coated on the substrate 102 by a sol-gel spray process. In another embodiment, the ARC layer 103 is an inorganic material, such as a $TiO_2$ layer, a composite film of $SiO_2$ and $TiO_2$ layer, or other suitable materials, formed by a CVD, PVD or other suitable deposition techniques. In one exemplary embodiment, the ARC layer 103 is a composite film having a film stack including a first pair of $SiO_2$ and $TiO_2$ layer and a second pair of $SiO_2$ and $TiO_2$ layer consecutively formed on the first surface 152 of the substrate 102. In one embodiment, the ARC layer 103 has a film refractive index at between about 1.1 and 1.4 and a thickness between about 30 nm and about 3000 nm.

In one embodiment, it is believed that the ARC 103 layer disposed on the substrate 102 may improve the overall current gain (conversion efficiency) of the solar cell 100, 200 for about 2-3 percent. In one embodiment, the substrate 102 is made from a low iron glass that has an iron concentration of between about 0.01 percent by weight and about 0.03 percent by weight.

At step 604, the barrier layer 104 may be formed on the second surface 154 of the substrate 102. As discussed above, the barrier layer 104 may be formed from a material that has high film conductivity and mobility so as to reduce the resistance of the first TCO layer 106. In one embodiment, the barrier layer 104 is a tin oxide layer ($SnO_2$) or an iron doped a tin oxide layer ($SnO_2$:Fe). In another embodiment, the barrier layer 104 is a silicon oxynitride, silicon nitride, silicon oxide layer, or combinations thereof. In one embodiment, the barrier layer 104 may be fabricated by a PVD chamber or a CVD chamber included in the production line of the solar cell system, such as the production line 900 depicted in FIG. 9, as further discussed below. In another embodiment, the barrier layer 104 may be pre-coated or pre-fabricated on the substrate 102 by a glass supplier prior to providing into the solar cell production line for processing. In one embodiment, the barrier layer 104 has a thickness between about 200 Å and about 400 Å. In one embodiment, it is believed that the barrier layer 104 disposed on the substrate 102 may improve overall current gain (conversion efficiency) of the solar cell 100, 200 for about 2-3 percent.

At step 606, the first TCO layer 106 is formed on the barrier layer 104. The first TCO layer 106 may be a $ZnO_2$, ITO, $SnO_2$, iron doped $SnO_2$ layer, aluminum doped $ZnO_2$ (AZO) layer, titanium oxide layer, doped titanium oxide layer or any other suitable materials, as discussed above. In one exemplary embodiment depicted in FIGS. 1 and 2, the first TCO layer 106 is a $SnO_2$ or an iron doped $SnO_2$ layer. Alternatively, the first TCO layer 106 is an aluminum oxide doped $ZnO_2$ (AZO) layer having an aluminum oxide dopant concentration at about 1 percent by weight and a zinc oxide material about 99 percent by weight.

At step 608, after the first TCO layer 106 is disposed on the substrate 102, the conductive contact layer 108 is formed on the first TCO layer 106. As discussed above, the conductive contact layer 108 provides a good interface between the first TCO layer 106 and subsequent to-be-formed solar cell junction 116. In one embodiment, the conductive contact layer 108 may be a titanium layer (Ti), tantalum layer, aluminum layer, titanium oxide layer ($TiO_2$), tantalum oxide layer, aluminum oxide layer and doped titanium containing layer, such as niobium doped titanium oxide layer ($TiO_2$:Nb) or aluminum doped titanium oxide layer ($TiO_2$:Al). In one embodiment, the conductive contact layer 108 may have a thickness between about 200 Å and about 700 Å In one embodiment, it is believed that the conductive contact layer 108 disposed on the substrate 102 may improve overall current gain (conversion efficiency) of the solar cell 100, 200 for about 2-5 percent.

At step 610, after the conductive contact layer 108 is formed on the substrate 102, the first p-i-n junction 116 is formed on the conductive contact layer 108. As discussed above, the first p-i-n junction 116 includes the heavily doped p-type amorphous silicon layer 109, the p-type amorphous silicon layer 110, optional interface barrier layer 111, the intrinsic type amorphous silicon layer 112 and the n-type microcrystalline silicon layer 114. As the intrinsic type amorphous silicon layer 112 may be formed having a relatively smaller bandgap by utilizing the process conditions of relatively high deposition temperature, relatively low pressure and relatively low hydrogen dilution during the deposition process, the intrinsic type amorphous silicon layer 112 may help to increase the overall conversion efficiency of the solar cell(s) containing the first p-i-n junction 116 disposed on the substrate 102. It is believed that the relatively high temperature used during the deposition process may assist in producing low bandgap films that have a low defect density and high current generation, which may advantageously improve the overall conversion efficiency of the solar cell junction. The relatively low deposition pressure used to form the intrinsic type amorphous silicon layer 112, such as less than 2.5 Torr, may also assist in depositing a layer that has good optoelectronic and microstructural properties and having less cluster phase hydrogen formed in the resultant film, leading to a smaller bandgap. Furthermore, the relatively low hydrogen dilution supplied in the gas mixture for depositing the intrinsic type amorphous silicon layer 112 may also assist in depositing an intrinsic type amorphous silicon layer 112 that has a smaller bandgap. In one embodiment, when the intrinsic type amorphous silicon layer 112 is formed having a relatively small bandgap, the optional interface layer 111 may be optionally formed prior to the deposition of the intrinsic type amorphous silicon layer 113, as discussed above. It is believed that by forming an intrinsic type amorphous silicon layer 112 with a relatively smaller bandgap the conversion efficiency (or overall current gain) of the solar cells 100, 200 can be increased by about 2-3 percent. In one example, the band gap of the amorphous silicon layer 112 as formed was about 1.71 eV using a hydrogen dilution ration of about 10:1 ($SiH_4/H_2$) versus a more conventionally formed amorphous silicon layer that typically has a 1.78 eV band gap, as measured using the Tauc method.

Furthermore, in one embodiment, the n-type microcrystalline silicon layer 114 formed on the first p-i-n junction 116 may be formed as an n-type microcrystalline silicon carbide layer. As discussed above, the carbon atoms formed in the n-type microcrystalline silicon carbide layer 114 is a highly conductive layer that can be formed with a desirable bandgap and refractive index. Accordingly, it is believed that by utilizing n-type microcrystalline silicon carbide layer 114 in the first p-i-n junction 116, the overall current gain (conversion efficiency) of the solar cell 100, 200 may be improved by about 2-4 percent. In the embodiment wherein the solar cell is formed as multiple junctions, such as the tandem junction depicted in FIG. 2, the overall current gain (conversion efficiency) of the solar cell 200 may be improved by about 3-9 percent, such as about 7 percent.

At step 610, after the conductive contact layer 108 is formed on the substrate 102, the first p-i-n junction 116 is formed on the conductive contact layer 108. As discussed above, the first p-i-n junction 116 includes the heavily doped p-type amorphous silicon layer 109, the p-type amorphous silicon layer 110, optional interface barrier layer 111, the intrinsic type amorphous silicon layer 112 and the n-type microcrystalline silicon layer 114. As the intrinsic type amorphous silicon layer 112 may be formed having a relatively smaller bandgap by utilizing the process conditions of relatively high deposition temperature, relatively low pressure and relatively low hydrogen dilution during the deposition process, the intrinsic type amorphous silicon layer 112 may help to increase the overall conversion efficiency of the solar cell(s) containing the first p-i-n junction 116 disposed on the substrate 102. It is believed that the relatively high temperature used during the deposition process may assist in producing low bandgap films that have a low defect density and high current generation, which may advantageously improve the overall conversion efficiency of the solar cell junction. The relatively low deposition pressure used to form the intrinsic type amorphous silicon layer 112, such as less than 2.5 Torr, may also assist in depositing a layer that has good optoelectronic and microstructural properties and having less cluster phase hydrogen formed in the resultant film, leading to a smaller bandgap. Furthermore, the relatively low hydrogen dilution supplied in the gas mixture for depositing the intrinsic type amorphous silicon layer 112 may also assist in depositing an intrinsic type amorphous silicon layer 112 that has a smaller bandgap. In one embodiment, when the intrinsic type amorphous silicon layer 112 is formed having a relatively small bandgap, the optional interface layer 111 may be optionally formed prior to the deposition of the intrinsic type amorphous silicon layer 113, as discussed above. It is believed that by forming an intrinsic type amorphous silicon layer 112 with a relatively smaller bandgap the conversion efficiency (or overall current gain) of the solar cells 100, 200 can be increased by about 2-3 percent. In one example, the band gap of the amorphous silicon layer 112 as formed was about 1.71 eV using a hydrogen dilution ratio of about 10:1 ($SiH_4/H_2$) versus a more conventionally formed amorphous silicon layer that typically has a 1.78 eV band gap, as measured using the Tauc method.

The second p-i-n junction 136 formed at step 614 includes the p-type microcrystalline silicon layer 130, the intrinsic type microcrystalline silicon layer 132 and the n-type amorphous silicon layer 134. As discussed above, the n-type layer 134 may be an n-type microcrystalline silicon layer. As discussed above, the secondary dopants, such as carbon atoms or nitrogen dopants, formed in the n-type amorphous/microcrystalline silicon layer 134 may increase the conductivity of the n-type amorphous/microcrystalline silicon layer 134 having a desirable bandgap and refractive index. In one embodiment, the n-type layer 134 formed in the second p-i-n junction 136 is formed as an n-type amorphous silicon carbide layer 134. It is believed that by utilizing n-type amorphous silicon carbide layer 134 in the second p-i-n junction 136, the overall current gain (conversion efficiency) of the solar cell 200 may be improved for about 1-3 percent.

At step 616, the conductive index matching layer 118 is formed on the second p-i-n junction 136, as depicted in FIG. 2. In the embodiment wherein the solar cell 100 only includes a single p-i-n junction, the conductive index matching layer 118 may be directly formed on the first p-i-n junction 116 as shown in FIG. 1. As discussed above, the conductive index matching layer 118 is configured to increase light reflection back to the first p-i-n junction 116 and/or the second p-i-n junction 136 so as to increase current generation in the junctions 116, 136. In one embodiment, the conductive index matching layer 118 is a silicon containing material, such as silicon oxide, silicon carbide, silicon oxynitride, silicon nitride, silicon oxycarbide (SiOC), silicon oxycarbon nitride (SiOCN), or other suitable silicon containing materials. In another embodiment, the conductive index matching layer 118 may also be configured as an indium tin oxide (ITO) layer as needed. In another embodiment, the conductive index matching layer 118 may not be formed as a continuous film layer. For example, the conductive index matching layer 118 may be formed as a non-continuous film layer, such as a thin layer of particles, to create an uneven reflection surface so as to assist reflecting and scattering light back to the first p-i-n junction 116 and/or the second p-i-n junction 136. In one embodiment, the particle size utilized to form the conductive index matching layer 118 has a diameter about 10 nm. In one embodiment, the conductive matching index layer 118 is a silicon carbide, silicon nitride, or a silicon oxynitride layer having a film thickness between about 50 Å and about 2000 Å, such as about 200 Å.

In one embodiment, the conductive index matching layer 118 may be formed by any suitable deposition techniques, such as PVD, CVD, electroplating, electroless plating or any other suitable manners. In one embodiment, the conductive index matching layer 118 may be formed in a CVD chamber so that the conductive index matching layer 118 may be formed within the same chamber where the n-type layer 114, 134 is formed. In this configuration, the n-type layer 114, 134 and the conductive index matching layer 118 may be formed in-situ in a single chamber without breaking vacuum so as to reduce manufacture cost and manufacture cycle time. In another embodiment, the conductive index matching layer 118 may be formed in separate chambers or individually formed in different processing tools or even different production lines as needed.

At step 618, after the conductive index matching layer 118 is formed on the substrate 102, the second TCO layer 120 is formed on the conductive index matching layer 118. Similar to the configuration of the first TCO layer 106, the second TCO layer 120 may be a $ZnO_2$, ITO, $SnO_2$, aluminum doped $ZnO_2$ (AZO) layer, or any other suitable materials, as discussed above. In one exemplary embodiment depicted in FIGS. 1 and 2, the second TCO layer 120 is an aluminum oxide doped $ZnO_2$ (AZO) layer having an aluminum oxide dopant concentration at about 2 percent by weight in zinc oxide material about 98 percent by weight. In one embodiment, a dopant material (e.g., indium, aluminum) is added to the second TCO layer 120 during the deposition process to form a layer that has more desirable optical, conductivity and/or barrier properties. In one example, the second TCO layer 120 comprise a tin oxide ($SnO_2$) layer that is doped with less than about 10% of indium. In another example, the second TCO layer 120 comprise a tin oxide ($SnO_2$) layer that is doped with less than about 10% of iron (Fe).

At step 620, the back metal electrode 122 is formed on the second TCO layer 120. The back metal electrode 122 assists reflecting light back to the solar cell junctions 116, 136 so as to improve current collection and generation therein. The back metal electrode 122 may include, but not limited to, a material selected from the group consisting of Al, Ag, Ti, Cr, Au, Cu, Pt, Ni, V, alloys thereof, or combinations thereof. In one particular embodiment, the back metal electrode 122 may be a silver (Ag) layer having a silicon or palladium (Pd) dopant concentration controlled at about 0.25 weight percent. In one embodiment, the back metal electrode 122 may in form of a composite film having a first layer of the silicon doped silver (Ag) layer and a second layer of nickel (Ni) vanadium (V) alloy material disposed on the first layer of the silicon or palladium (Pd) doped silver (Ag) layer.

Furthermore, an additional interface layer, such as the additional interface layer 501 depicted in FIG. 5, may be disposed between the back metal electrode 122 and the second TCO layer 120 to improve interface adhesion. In one embodiment, the additional interface layer may be a thin chromium (Cr) layer having a thickness controlled at less than 50 Å, such as about less than 20 Å.

It is believed that by using the additional interface layer, the back metal electrode 122 with composite structure having the silicon or palladium (Pd) doped silver (Ag) layer and the nickel (Ni) vanadium (V) alloy material disposed on the silicon doped silver (Ag) layer, the overall current gain (conversion efficiency) of the solar cell 100, 200 may be improved for about 5-8 percent.

After formation of the back metal electrode 122, the solar cell structure is completed on the substrate 102. Accordingly, by using all the materials, structures, barrier layers, interface layers, and materials as discussed above, the overall current gain (conversion efficiency) of the solar cell 100, 200 may be improved to at least about 10 percent, thereby efficiently improve the electronic and device performance of the formed device accordingly.

System and Apparatus Configurations

Figure 7:
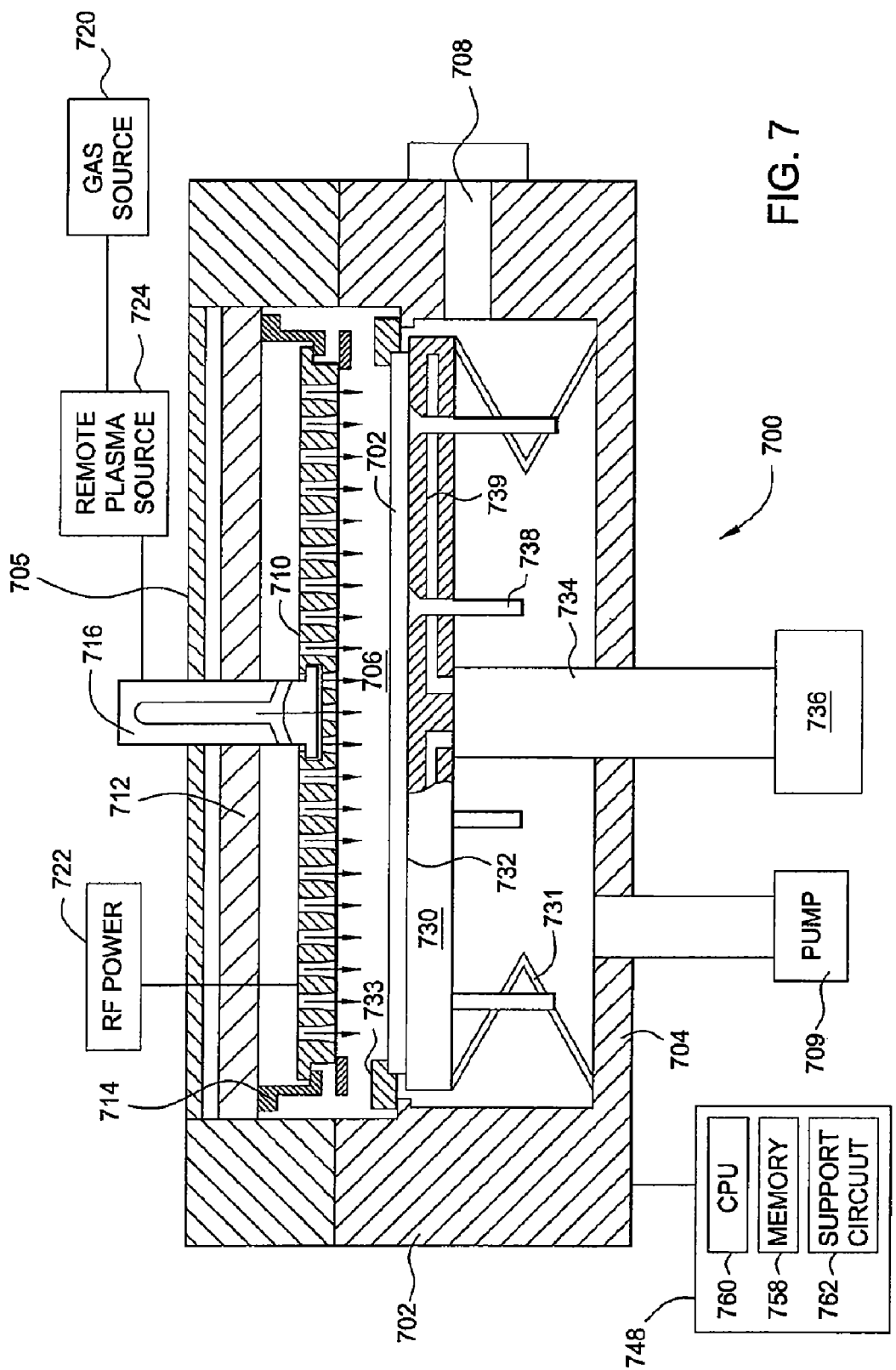
FIG. 7 is a cross-sectional view of an apparatus according to one embodiment of the invention.

FIG. 7 is a schematic cross-section view of one embodiment of a plasma enhanced chemical vapor deposition (PECVD) chamber, or chamber 700, in which one or more films of a thin-film solar cell, such as the solar cells of FIGS. 1-2 may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 700 generally includes walls 702, a bottom 704, and a showerhead 710, and substrate support 730 which define a process volume 706. The process volume is accessed through a valve 708 such that the substrate, may be transferred in and out of the chamber 700. The substrate support 730 includes a substrate receiving surface 732 for supporting a substrate 102 and stem 734 coupled to a lift system 736 to raise and lower the substrate support 730. A shadow ring 733 may be optionally placed over periphery of the substrate 102. Lift pins 738 are moveably disposed through the substrate support 730 to move a substrate to and from the substrate receiving surface 732. The substrate support 730 may also include heating and/or cooling elements 739 to maintain the substrate support 730 at a desired temperature. The substrate support 730 may also include grounding straps 731 to provide RF grounding at the periphery of the substrate support 730.

The showerhead 710 is coupled to a backing plate 712 at its periphery by a suspension 714. The showerhead 710 may also be coupled to the backing plate 712, or wall 705, by one or more center supports 716 to help prevent sag and/or control the straightness/curvature of the showerhead 710. A gas source 720 is coupled to the backing plate 712 to provide gas through the backing plate 712 and through the showerhead 710 to the substrate receiving surface 732. A vacuum pump 709 is coupled to the chamber 700 to control the process volume 706 at a desired pressure. An RF power source 722 is coupled to the backing plate 712 and/or to the showerhead 710 to provide a RF power to the showerhead 710 so that an electric field is created between the showerhead 710 and the substrate support 730 so that a plasma may be generated from the gases between the showerhead 710 and the substrate support 730. Various RF frequencies may be used, such as a frequency between about 0.3 MHz and about 200 MHz. In one embodiment the RF power source is provided at a frequency of 13.56 MHz.

A remote plasma source 724, such as an inductively coupled remote plasma source, may also be coupled between the gas source 720 and the backing plate 712. Between processing substrates, a cleaning gas may be provided to the remote plasma source 724 so that a remote plasma is generated and provided to clean chamber components. The cleaning gas may be further excited by the RF power source 722 provided to the showerhead. Suitable cleaning gases include but are not limited to $NF_3$, $F_2$, and $SF_6$.

The deposition methods for one or more layers, such as one or more of the layers of FIGS. 1-5, may include the following deposition parameters in the process chamber of FIG. 7 or other suitable chamber. A substrate having a surface area of 10,000 $cm^2$ or more, such as 40,000 $cm^2$ or more, and for example 55,000 $cm^2$ or more is provided to the chamber. It is understood that after processing the substrate may be cut to form smaller solar cells.

In one embodiment, the heating and/or cooling elements 739 may be set to provide a substrate support temperature during deposition of about 400° C. or less, for example between about 100° C. and about 400° C., such as between about 150° C. and about 300° C., such as about 200° C.

The spacing during deposition between the top surface of a substrate disposed on the substrate receiving surface 732 and the showerhead 710 may be between 400 mil and about 1,200 mil, such as between 400 mil and about 800 mil.

A controller 748 is coupled to the processing chamber 700. The controller 548 includes a central processing unit (CPU) 760, a memory 758, and support circuits 762. The controller 748 is utilized to control the process sequence, regulating the gas flows from the gas source 720 into the chamber 500 and controlling power supply from the RF power source 722 and the remote plasma source 724. The CPU 760 may be of any form of a general purpose computer processor that can be used in an industrial setting. The software routines can be stored in the memory 758, such as random access memory, read only memory, floppy or hard disk drive, or other form of digital storage. The support circuits 762 are conventionally coupled to the CPU 760 and may comprise cache, clock circuits, input/output subsystems, power supplies, and the like. The software routines, when executed by the CPU 760, transform the CPU into a specific purpose computer (controller) 748 that controls the processing chamber 500 such that the processes, such as described above, are performed in accordance with the present invention. The software routines may also be stored and/or executed by a second controller (not shown) that is located remotely from the processing chamber 700.

Figure 8:
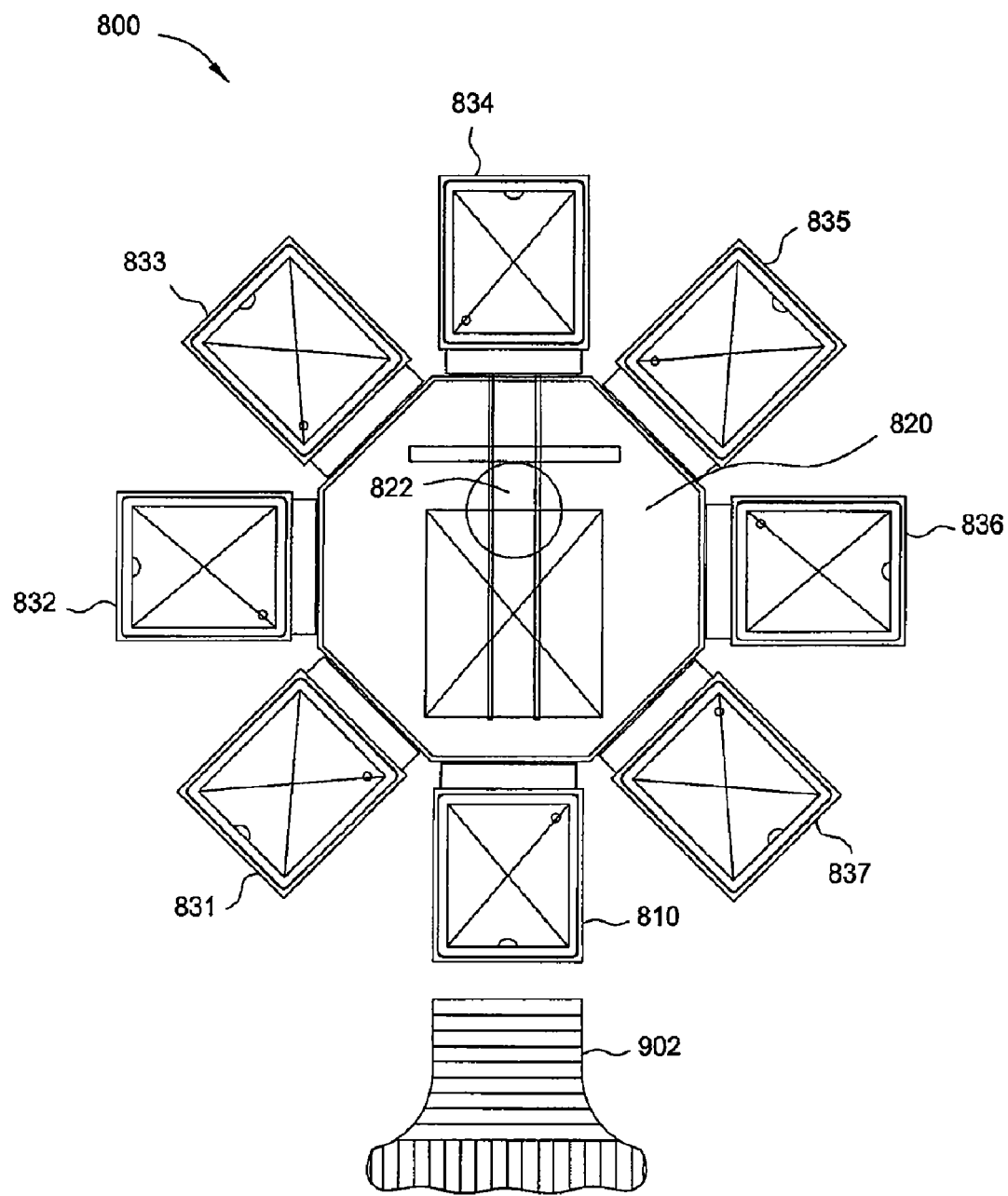
FIG. 8 is a plan view of an apparatus according to another embodiment of the invention.

FIG. 8 is a top schematic view of one embodiment of a process system 800 having a plurality of process chambers 831-837, such as PECVD chamber 700 of FIG. 7 or other suitable chambers, such as PVD chambers, plating chambers, or coating chambers capable of depositing films for solar cells depicted in FIGS. 1-2. The process system 800 includes a transfer chamber 820 coupled to a load lock chamber 810 and the process chambers 831-837. The load lock chamber 810 allows substrates to be transferred between the ambient environment outside the system 800 and vacuum environment within the transfer chamber 820 and process chambers 831-837. The load lock chamber 810 includes one or more evacuatable regions holding one or more substrate. The evacuatable regions are pumped down during input of substrates into the system 800 and are vented during output of the substrates from the system 800. The transfer chamber 820 has at least one vacuum robot 822 disposed therein that is adapted to transfer substrates between the load lock chamber 810 and the process chambers 831-837. While seven process chambers are shown in FIG. 8; this configuration is not intended to be limiting as to the scope of the invention, since the system may have any suitable number of process chambers.

In certain embodiments of the invention, the system 800 is configured to deposit the first or second p-i-n junction (e.g., reference numeral 116, 136) of a multi-junction solar cell. In one embodiment, one of the process chambers 831-837 is configured to deposit the p-type layer(s) of the first and/or second p-i-n junction while the remaining process chambers 831-837 are each configured to deposit both the intrinsic type layer(s) and the n-type layer(s). The intrinsic type layer(s) and the n-type layer(s) of the p-i-n junctions may be deposited in the same chamber without any passivation process in between the deposition steps. Thus, in one configuration, a substrate enters the system through the load lock chamber 810, the substrate is then transferred by the vacuum robot into the dedicated process chamber configured to deposit the p-type layer(s). Next, after forming the p-type layer the substrate is transferred by the vacuum robot into one of the remaining process chamber configured to deposit both the intrinsic type layer(s) and the n-type layer(s). After forming the intrinsic type layer(s) and the n-type layer(s) the substrate is transferred by the vacuum robot 822 back to the load lock chamber 810. In certain embodiments, the time to process a substrate with the process chamber to form the p-type layer(s) is approximately 4 or more times faster, such as 6 or more times faster, than the time to form the intrinsic type layer(s) and the n-type layer(s) in a single chamber. Therefore, in certain embodiments of the system to deposit the first p-i-n junction, the ratio of p-chambers to i/n-chambers is 1:4 or more, such as 1:6 or more. The throughput of the system including the time to provide plasma cleaning of the process chambers may be about 10 substrates/hr or more, for example 20 substrates/hr or more.

In certain embodiments of the invention, a system 800 is configured to deposit the p-i-n junction (e.g., reference numerals 116, 136) solar cells. In one embodiment, one of the process chambers 831-837 is configured to deposit the p-type layer(s) while the remaining process chambers 831-837 are each configured to deposit both the intrinsic type layer(s) and the n-type layer(s) and the conductive index matching layer (e.g., reference numeral 118). The interface barrier layer (e.g., reference numeral 111) may be optionally formed with the p-type layer(s) or with the intrinsic type layer(s) and the n-type layer(s). Also, the heavily doped p-type layer ($p^{++}$ layer, e.g., reference numeral 109) may be formed with the p-type layer(s) in a chamber. The intrinsic type layer(s) and the n-type layer(s) may be deposited in the same chamber. In certain embodiments, the time to process a substrate with the process chamber to form the p-type layer(s) is approximately 4 or more times faster than the time to form the intrinsic type layer(s) and the n-type layer(s) in a single chamber. Therefore, in certain embodiments of the system to deposit the p-i-n junction, the ratio of p-chambers to i/n-chambers is 1:4 or more, such as 1:6 or more. The throughput of the system including the time to provide plasma cleaning of the process chambers may be about 3 substrates/hr or more, such as 5 substrates/hr or more.

In certain embodiments, the throughput of a system 800 that is configured for depositing the p-i-n junction comprising an intrinsic type amorphous silicon layer has a throughput that is two times larger than the throughput of a system 800 that is used to deposit the second p-i-n junction comprising an intrinsic type microcrystalline silicon layer, due to the difference in thickness between the intrinsic type microcrystalline silicon layer(s) and the intrinsic type amorphous silicon layer(s). Therefore, a single system 800 that is adapted to deposit the first p-i-n junction, which comprises an intrinsic type amorphous silicon layer, can be matched with two or more systems 800 that are adapted to deposit a second p-i-n junction, which comprises an intrinsic type microcrystalline silicon layer. Once a first p-i-n junction has been formed in one system, the substrate may be exposed to the ambient environment (i.e., vacuum break) and transferred to the second system, where the second p-i-n junction is formed. A wet or dry cleaning of the substrate between the first system depositing the first p-i-n junction and the second p-i-n junction may be necessary.

Figure 9:
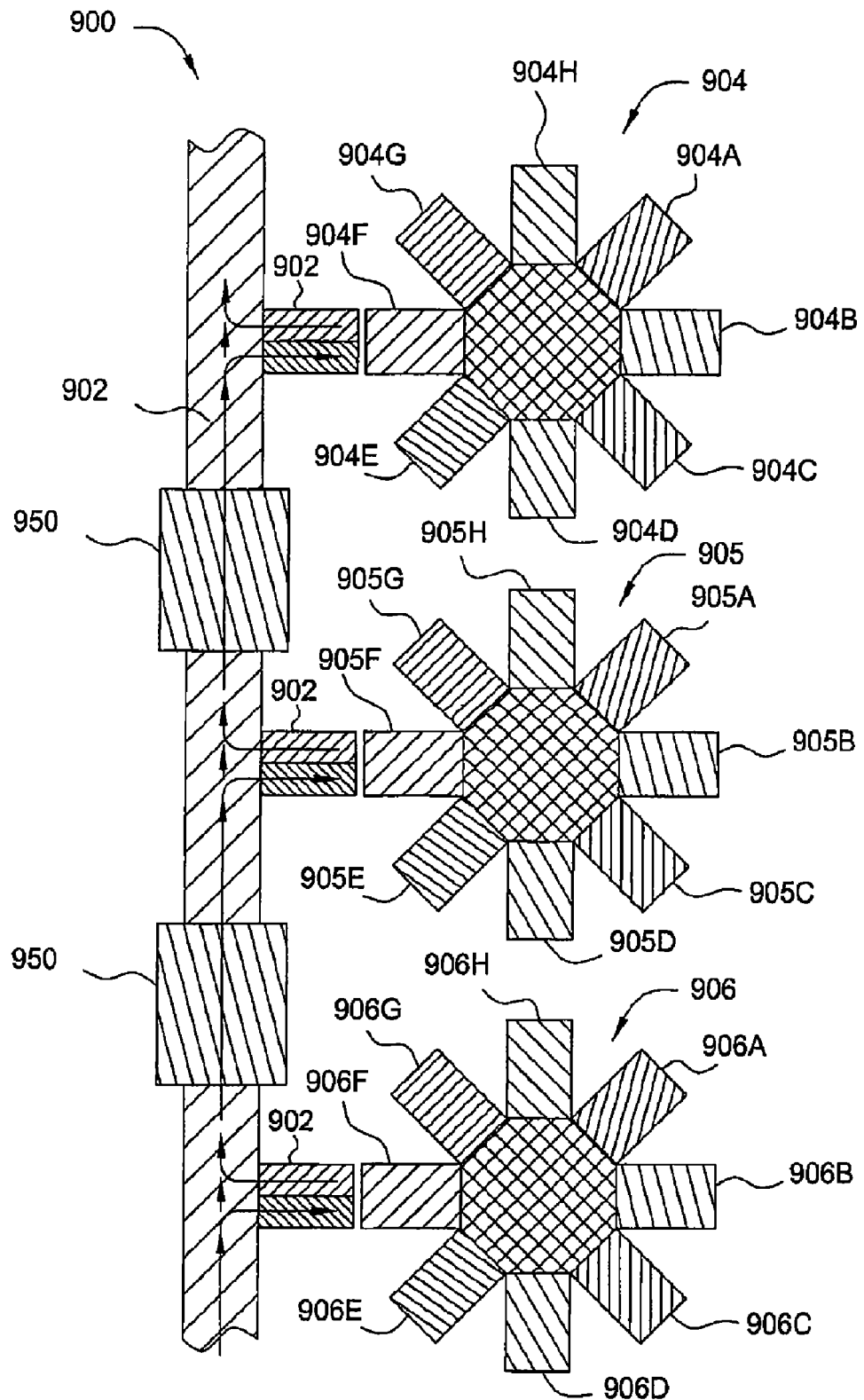
FIG. 9 is a plan view of a portion of a production line having apparatuses of FIGS. 7 and 8 incorporated therein according to one embodiment of the invention.

FIG. 9 illustrates one configuration of a portion of a production line 900 that has a plurality of deposition systems 904, 905, 906, or cluster tools, that are transferrably connected by automation devices 902. In one configuration, as shown in FIG. 9, the production line 900 comprises a plurality of deposition systems 904, 905, 906 that may be utilized to form one or more layers, such as TCO layers, conductive contact layers, ARC layers, barrier layer, conductive index matching layer or the like, form p-i-n junction(s), or form a complete solar cell device on a substrate 102. The systems 904, 905, 906 may be similar to the system 800 depicted in FIG. 8, but are generally configured to deposit different layer (s) or junction(s) on the substrate 102. In general, each of the deposition systems 904, 905, 906 each have a load lock 904F, 905F, 906F, which is similar to the load lock 810, that are each in transferable communication with an automation device 902.

During process sequencing, a substrate is generally transported from a system automation device 902 to one of the systems 904, 905, 906. In one embodiment, the system 906 has a plurality of chambers 906A-906H that are each configured to deposit or process one or more layers in the formation of a first p-i-n junction, the system 905 having a plurality of chambers 905A-905H is configured to deposit the multiple layers formed in the first p-i-n junction and the system 904 having the plurality of chambers 904A-904H is configure to deposit or process one or more layers in the formation of a second p-i-n junction. It is noted that the number of systems and the number of the chambers configured to deposit each layer in each of the systems may be varied to meet different process requirements and configurations. In one embodiment, it is desirable to separate or isolate the WSR layer deposition process chambers from the p-type, intrinsic or n-type layer deposition chambers to prevent the cross contamination of one or more of the layers in the formed solar cell device or subsequently formed solar cell devices. In configurations where the WSR layer comprises a carbon or an oxygen containing layer, it is generally important to prevent the cross contamination of the formed intrinsic layer(s) in the formed junctions, and/or prevent particle generation problems due to the stress in the oxygen or carbon containing deposited material layers formed on the shields or other chamber components in a processing chamber.

The automation device 902 may generally comprise a robotic device or conveyor that is adapted to move and position a substrate. In one embodiment, a plurality of automation devices 902 and a controller 748, which is connected to all of the processing chambers and automation devices 902 in the production line 900, are used in combination to serially transfer a plurality of substrates so that the processing steps in processing sequence 600 can be performed on a plurality of substrates 102. In one example, the automation device 902 is a series of conventional substrate conveyors (e.g., roller type conveyor) and/or robotic devices (e.g., 6-axis robot, SCARA robot) that are configured to move and position the substrate within the production line 900 as desired. In one embodiment, one or more of the automation devices 902 also contains one or more substrate lifting components, or drawbridge conveyors, that are used to allow substrates upstream of a desired system to be delivered past a substrate that would be blocking its movement to another desired position within the production line 900. In this way the movement of substrates to the various systems will not be impeded by other substrates waiting to be delivered to another system.

In one embodiment of the production line 900, a patterning chamber 950 is in communication with one or more of the automation devices 902, and is configured to perform a patterning process on one or more of the layers in the formed WSR layer, conductive index matching layer, barrier layer, or TCO layer. In one example, the patterning chamber 950 is advantageously positioned to perform a patterning process on one or more of the layers by conventional means. It is also contemplated that the patterning process can also be used to etch one or more regions in one or more of the layers during the solar cell devices formation process. While the configurations of the patterning chamber 950 generally discuss etching type patterning processes, this configuration need not be limiting as to the scope of the invention described herein. In one embodiment, the patterning chamber 950 is used to remove one or more regions in one or more of the formed layers and/or deposit one or more material layers (e.g., dopant containing materials, metals pastes) on the one or more of the formed layers on the substrate surface.

While the foregoing is directed to embodiments of the present invention, other and further embodiments of the invention may be devised without departing from the basic scope thereof, and the scope thereof is determined by the claims that follow. For example, the process chamber of FIG. 7 has been shown in a horizontal position. It is understood that in other embodiments of the invention the process chamber may be in any non-horizontal position, such as vertical. Embodiments of the invention have been described in reference to the multi-process chamber cluster tool in FIGS. 8 and 9, but in-line systems and hybrid in-line/cluster systems may also be used. Embodiments of the invention have been described in reference to a first system configured to form a first p-i-n junction and a second system configured to form a second p-i-n junction. Finally, the embodiments described herein are p-i-n configurations generally applicable to transparent substrates, such as glass, but other embodiments are contemplated in which n-i-p junctions, single or multiply stacked, are constructed on opaque substrates such as stainless steel or polymer in a reverse deposition sequence.

Embodiments of a production line 900 that include all of the processing chambers used to perform the processing steps in the process sequence 600, and are interconnected by one or more substrate transferring automation devices 902, have a distinct advantages over other prior art processing configuration that require manual handling steps and/or manually performed processes, since the throughput of the production line 900 can be increased over these prior configurations, the chance of damaging the often fragile glass substrates during the transfer or performance of one or more of the processing steps is reduced, and the substrate-to-substrate process repeatability can be increased. Substrate handling related defects that are created during one or more of the steps in the solar cell formation process are greatly increased when one or more coatings are disposed on the two major surfaces of the substrate 102, such as surfaces 152 and 154. Therefore, the fewer the number of manual processing steps and/or transferring steps that require the substrates to be specially supported or packaged, due to the length of transportation between processing steps, the greater the chances of forming a reliable solar cell device.

Thus, an apparatus and methods for forming high efficiency cell junctions in a solar cell device are provided. The method advantageously produces high conversion efficiency solar cell improved to at least about 10% even after the efficiency has degraded due to LID, for example, as compared to the about 7%-8% efficiency achieved by current conventional solar cell devices. In one embodiment, greater than 10% efficiency is achieved by selecting and forming a solar cell device that contains an ARC layer, a barrier layer, a conductive contact layer, a conductive index matching interface layer, a low bandgap intrinsic amorphous silicon layer, an n-type microcrystalline silicon carbide layer in a first p-i-n junction, an n-type amorphous silicon layer in a second p-i-n junction, a conductive index matching layer, and composite film stack in the back metal electrode. By utilizing the new film structure and new materials described herein, the conversion efficiency of the solar cell devices may be efficiently improved and increased as desired.

While the foregoing is directed to embodiments of the present invention, other and further embodiments of the invention may be devised without departing from the basic scope thereof, and the scope thereof is determined by the claims that follow.

What is claimed is:
1. A method of forming a solar cell device, comprising:
   forming a first transparent conductive oxide layer over a first surface of a substrate, wherein the first transparent conductive oxide layer comprises tin and oxygen, and the substrate comprises a glass material having an iron concentration less than about 0.03% by weight;
   forming a conductive contact layer disposed on the first transparent conductive oxide layer, wherein the resistivity of a combination of the first transparent conductive oxide layer and the conductive contact layer is less than about 10 Ohms per square; and
   forming a first p-i-n junction on the conductive contact layer, wherein forming the first p-i-n junction comprises:
      forming a p-doped amorphous silicon layer on the conductive contact layer;
      forming an interface barrier layer over the p-type amorphous silicon layer, wherein the interface barrier layer comprises silicon carbide;
      forming an intrinsic type amorphous silicon layer over the interface barrier layer; and
      forming an n-type microcrystalline silicon layer on the conductive contact layer.
2. The method of claim 1, further comprising:
   forming a conductive index matching layer over the first p-i-n junction; and
   forming a second transparent conductive oxide layer on the conductive index matching layer.
3. The method of claim 2 further comprising forming a second p-i-n junction between the first p-i-n junction and the conductive index matching layer, wherein forming the second p-i-n junction comprises:
   forming a p-doped microcrystalline silicon layer over the n-type microcrystalline silicon layer;
   forming an intrinsic type microcrystalline silicon layer over the p-type microcrystalline silicon layer; and
   forming an n-type amorphous silicon layer on the intrinsic type microcrystalline silicon layer.
4. The method of claim 1, wherein the n-type microcrystalline silicon layer comprises silicon and carbon.
5. The method of claim 1, wherein the conductive contact layer comprises a niobium doped titanium oxide layer formed in a physical vapor deposition chamber.
6. The method of claim 5, further comprising:
   forming a barrier layer between the first surface of the substrate and the first transparent conductive oxide layer;
   forming a conductive index matching layer over the first p-i-n junction; and
   forming a second p-i-n junction between the first p-i-n junction and the conductive index matching layer, wherein forming the second p-i-n junction comprises:
      forming a p-type microcrystalline silicon layer over the n-type microcrystalline silicon layer;
      forming an intrinsic type microcrystalline silicon layer over the p-type microcrystalline silicon layer; and
      forming an n-type amorphous silicon layer on the intrinsic type microcrystalline silicon layer.
7. The method of claim 1, further comprising:
   forming a second transparent conductive oxide layer; and
   forming a conductive index matching layer, wherein the conductive index matching layer is disposed between the n-type microcrystalline silicon layer and the second transparent conductive oxide layer, and the conductive index matching layer comprises a material that has an index of refraction that is less than the index of refraction of the second transparent conductive oxide layer.

8. The method of claim 7, wherein the conductive index matching layer comprises a material selected from a group consisting of silicon oxide, silicon oxynitride, silicon nitride, silicon oxycarbide, silicon oxycarbon nitride and indium tin oxide.

9. The method of claim 7, further comprising:
forming a second p-i-n junction between the first p-i-n junction and the conductive index matching layer, wherein forming the second p-i-n junction comprises:
forming a p-type microcrystalline silicon layer over the n-type microcrystalline silicon layer;
forming an intrinsic type microcrystalline silicon layer over the p-type microcrystalline silicon layer; and
forming an n-type amorphous silicon layer on the intrinsic type microcrystalline silicon layer.

10. The method of claim 7, further comprising forming an interface barrier layer between the p-type amorphous silicon layer and the intrinsic type amorphous silicon layer, wherein the interface barrier layer comprises silicon carbide.

11. The method of claim 7, further comprising:
forming an intrinsic type amorphous silicon layer between a p-type amorphous silicon layer and a n-type microcrystalline silicon carbide layer, wherein the intrinsic type amorphous silicon layer is formed by the following steps comprising:
providing a gas mixture to the surface of the substrate in a processing chamber, wherein the gas mixture includes a flow rate ratio of a hydrogen gas to a silane gas less than 6;
controlling a substrate temperature between about 220 degrees Celsius and about 250 degrees Celsius; and
controlling a process pressure in the processing chamber at between about 1 Torr and about 2 Torr.

12. The method of claim 1, wherein the n-type microcrystalline silicon layer comprises an n-type microcrystalline silicon carbide layer.

13. The method of claim 1, further comprising:
forming an antireflection coating layer on a second surface of the substrate, wherein the index of refraction of the formed antireflection coating layer is less than the index of refraction of the substrate; and
forming a substrate barrier layer between the first surface of the substrate and the first transparent conductive oxide layer.

14. A method of forming a solar cell device, comprising:
forming a first transparent conductive oxide layer over a first surface of a substrate, wherein the first transparent conductive oxide layer comprises tin and oxygen, and the substrate comprises a glass material having an iron concentration less than about 0.03% by weight;
forming a conductive contact layer disposed on the first transparent conductive oxide layer, wherein the resistivity of a combination of the first transparent conductive oxide layer and the conductive contact layer is less than about 10 Ohms per square; and
forming a first p-i-n junction on the conductive contact layer, wherein forming the first p-i-n junction comprises:
forming a p-doped amorphous silicon layer on the conductive contact layer;
forming an intrinsic type amorphous silicon layer over the p-type amorphous silicon layer, wherein forming the intrinsic type amorphous silicon layer comprises:
providing a gas mixture to the surface of the substrate in a processing chamber, wherein the gas mixture includes a flow rate ratio of a hydrogen gas to a silane gas less than 6;
controlling a substrate temperature between about 220 degrees Celsius and about 250 degrees Celsius; and
controlling a process pressure in the processing chamber at between about 1 Torr and about 2 Torr; and
forming an n-type microcrystalline silicon layer on the conductive contact layer.

15. The method of claim 14, further comprising:
forming an interface barrier layer between the p-type amorphous silicon layer and the intrinsic type amorphous silicon layer, wherein the interface barrier layer comprises a silicon carbide layer.

16. A method of forming a solar cell device, comprising:
forming a first transparent conductive oxide layer over a first surface of a substrate, wherein the first transparent conductive oxide layer comprises tin and oxygen;
forming a conductive contact layer disposed on the first transparent conductive oxide layer;
forming a first p-i-n junction over the conductive contact layer, wherein forming the first p-i-n junction comprises:
forming a p-type amorphous silicon layer on the conductive contact layer;
forming an intrinsic type amorphous silicon layer over the p-type amorphous silicon layer, wherein forming the intrinsic type amorphous silicon layer comprises:
providing a gas mixture to the surface of the substrate in a processing chamber, wherein the gas mixture includes a flow rate ratio of a hydrogen gas to a silane gas less than 6;
controlling a substrate temperature between about 220 degrees Celsius and about 250 degrees Celsius; and
controlling a process pressure in the processing chamber at between about 1 Torr and about 2 Torr;
forming an n-type microcrystalline silicon layer on the intrinsic type amorphous silicon layer;
forming a second p-i-n junction over the first p-i-n junction, wherein forming the second p-i-n junction comprises:
forming a p-type microcrystalline silicon layer over the n-type microcrystalline silicon layer;
forming an intrinsic type microcrystalline silicon layer over the p-type microcrystalline silicon layer; and
forming an n-type amorphous silicon layer on the intrinsic type microcrystalline silicon layer;
forming a conductive index matching layer over the first p-i-n junction; and
forming a second transparent conductive oxide layer on the conductive index matching layer.

17. The method of claim 16, further comprising:
forming an antireflection coating layer on a second surface of the substrate, wherein the index of refraction of the formed antireflection coating layer is less than the index of refraction of the substrate, and the substrate comprises a glass material having an iron concentration less than about 0.03% by weight; and forming a barrier layer between the first surface of the substrate and the first transparent conductive oxide layer.

18. The method of claim 16, wherein the conductive contact layer comprises a niobium doped titanium oxide layer formed in a physical vapor deposition chamber.

19. The method of claim 16, wherein the n-type microcrystalline silicon layer comprises silicon and carbon.

20. The method of claim 16, further comprising forming an interface barrier layer between the p-type amorphous silicon layer and the intrinsic type amorphous silicon layer, wherein the interface barrier layer comprises silicon carbide.

21. The method of claim 16, wherein the conductive index matching layer and the second transparent conductive oxide layer are disposed between the first p-i-n junction and the second p-i-n junction.

* * * * *

UNITED STATES PATENT AND TRADEMARK OFFICE
CERTIFICATE OF CORRECTION

| | |
|---|---|
| PATENT NO. | : 8,252,624 B2 |
| APPLICATION NO. | : 12/980132 |
| DATED | : August 28, 2012 |
| INVENTOR(S) | : Tanner et al. |

It is certified that error appears in the above-identified patent and that said Letters Patent is hereby corrected as shown below:

In Examples:

Column 28, Line 14, please delete "ration" and insert --ratio-- therefor;

Column 28, Lines 33-67, and Column 29, Lines 1-8, please delete

"At step 610, after the conductive contact layer 108 is formed on the substrate 102, the first p-i-n junction 116 is formed on the conductive contact layer 108. As discussed above, the first p-i-n junction 116 includes the heavily doped p-type amorphous silicon layer 109, the p-type amorphous silicon layer 110, optional interface barrier layer 111, the intrinsic type amorphous silicon layer 112 and the n-type microcrystalline silicon layer 114. As the intrinsic type amorphous silicon layer 112 may be formed having a relatively smaller bandgap by utilizing the process conditions of relatively high deposition temperature, relatively low pressure and relatively low hydrogen dilution during the deposition process, the intrinsic type amorphous silicon layer 112 may help to increase the overall conversion efficiency of the solar cell(s) containing the first p-i-n junction 116 disposed on the substrate 102. It is believed that the relatively high temperature used during the deposition process may assist in producing low bandgap films that have a low defect density and high current generation, which may advantageously improve the overall conversion efficiency of the solar cell junction. The relatively low deposition pressure used to form the intrinsic type amorphous silicon layer 112, such as less than 2.5 Torr, may also assist in depositing a layer that has good optoelectronic and microstructural properties and having less cluster phase hydrogen formed in the resultant film, leading to a smaller bandgap. Furthermore, the relatively low hydrogen dilution supplied in the gas mixture for depositing the intrinsic type amorphous silicon layer 112 may also assist in depositing an intrinsic type amorphous silicon layer 112 that has a smaller bandgap. In one embodiment, when the intrinsic type amorphous silicon layer 112 is formed having a relatively small bandgap, the optional interface layer 111 may be optionally formed prior to the deposition of the intrinsic type amorphous silicon layer 113, as discussed above. It is believed that by forming an intrinsic type amorphous silicon layer 112 with a relatively smaller bandgap the conversion efficiency (or overall current gain) of the solar cells 100, 200 can be increased by about 2-3 percent. In one example, the band gap of the amorphous Signed and Sealed this
Eighteenth Day of December, 2012

David J. Kappos
*Director of the United States Patent and Trademark Office* silicon layer 112 as formed was about 1.71 eV using a hydrogen dilution ratio of about 10:1 ($SiH_4/H_2$) versus a more conventionally formed amorphous silicon layer that typically has a 1.78 eV band gap, as measured using the Tauc method."

and insert

--At step 612, an optional wavelength selective reflector (WSR) layer 150 may be formed on the first p-i-n junction 116. Subsequently, at step 614, the second p-i-n junction 136 may be formed on the WSR layer 150 to form the solar cell 200 as a tandem junction, as shown in Figure 2. It is noted that in the embodiment wherein the solar cell is configured to form as a single junction, such as the solar cell 100 depicted in Figure 1, step 612 and 614, as grouped by the dotted line 622, may be eliminated. In the embodiment wherein the solar cell junction is configured to form as a tandem junction solar cell 200, as shown in Figure 2, the WSR layer 150 at step 612 and the second p-i-n junction 136 may be sequentially and consecutively formed on the first p-i-n junction 116. In one embodiment, the WSR layer 150 may be optional formed on the first p-i-n junction 116. In the embodiment wherein the WSR layer 150 is not present, the second p-i-n junction 136 may be directly formed on the first p-i-n junction 116. In one embodiment, the WSR layer 150 is a n-type microcrystalline silicon carbide layer or silicon oxynitride layer having a thickness between about 500 Å and about 5,000 Å, such as between about 1,000 Å and about 2,000 Å, for example about 1,500 Å.-- therefor;

In the Claims

Column 37, Claim 14, Line 62, please delete "iunction" and insert --junction-- therefor.